United States Patent
Trelford et al.

(10) Patent No.: US 11,792,928 B2
(45) Date of Patent: Oct. 17, 2023

(54) PRINTED CIRCUIT BOARDS WITH PLATED BLIND SLOTS FOR IMPROVED VERTICAL ELECTRICAL AND/OR THERMAL CONNECTIONS

(71) Applicant: ABB Schweiz AG, Baden (CH)

(72) Inventors: John Andrew Trelford, Richardson, TX (US); Robert Joseph Roessler, Wylie, TX (US); Jose Daniel Rogers, Mesquite, TX (US); Arturo Silva, Allen, TX (US); Alok Lohia, Dallas, TX (US)

(73) Assignee: Acleap Power Inc., Taipei (TW)

( * ) Notice: Subject to any disclaimer, the term of this patent is extended or adjusted under 35 U.S.C. 154(b) by 27 days.

(21) Appl. No.: 17/554,288

(22) Filed: Dec. 17, 2021

(65) Prior Publication Data
US 2023/0199958 A1 Jun. 22, 2023

(51) Int. Cl.
| | |
|---|---|
| *H05K 1/02* | (2006.01) |
| *H05K 1/11* | (2006.01) |
| *H05K 3/00* | (2006.01) |
| *H05K 3/42* | (2006.01) |
| *H05K 1/18* | (2006.01) |

(52) U.S. Cl.
CPC .......... *H05K 1/116* (2013.01); *H05K 1/0206* (2013.01); *H05K 3/0035* (2013.01); *H05K 3/0038* (2013.01); *H05K 3/0047* (2013.01); *H05K 3/421* (2013.01); *H05K 1/184* (2013.01); *H05K 3/429* (2013.01); *H05K 2201/0979* (2013.01); *H05K 2201/09518* (2013.01)

(58) Field of Classification Search
CPC .......................... H05K 1/0204; H05K 1/0206
See application file for complete search history.

(56) References Cited

U.S. PATENT DOCUMENTS

| | | | |
|---|---|---|---|
| 10,820,420 B2 | 10/2020 | Roessler | |
| 10,993,325 B2 | 4/2021 | Trelford et al. | |
| 2008/0315398 A1* | 12/2008 | Lo | ........ H01L 23/5389 257/706 |
| 2013/0092721 A1 | 4/2013 | Trelford et al. | |
| 2022/0301975 A1* | 9/2022 | Ham | ...... H01L 21/486 |

* cited by examiner

*Primary Examiner* — Jeremy C Norris
(74) *Attorney, Agent, or Firm* — Armstrong Teasdale LLP

(57) ABSTRACT

In one aspect, a PCB is provided. The PCB includes at least one insulating layer, a blind slot, and at least one via. The at least on insulating layer includes a first surface and a second surface opposite the first surface. The blind slot is plated and formed in the at least one insulating layer, where the blind slot partially extends from the first surface to the second surface, and where the blind slot includes a conductive plating bonded along a major surface of the blind slot. The at least one via is electrically conductive and filled, where the at least one via is coupled with and extends between the conductive plating of the blind slot and the second surface of the at least one insulating layer.

20 Claims, 26 Drawing Sheets

Total Thermal Resistance = 2.90 C/W,
Temperature Rise at 2W = 5.8C

← 2600

| Solder Joint Calculation | |
|---|---|
| | |
| SAC305 Solder Resistivity (Ohm*m) | 1.32E-07 |
| (Ohm*mil) | 5.20E-03 |
| | |
| Slot Length (mils) | 110 |
| Slot Width (mils) | 44 |
| | |
| | |
| | |
| | |
| | |
| Area (square mils) | 4840 |
| Solder Joint Thickness (mils) = | 8 |
| | |
| Resistance (ohms) = | 8.59E-06 |
| | |
| | |
| SAC305 Thermal Conductivity (W/m*K) = | 58 |
| SAC305 Thermal Conductivity (W/mil*K) = | 0.0014732 |
| | |
| Thermal Resistance (C/W) = | 1.12 |

FIG. 26

| Inductor Tab Calculation | |
|---|---|
| Copper Resistivity (Ohm*m) | 1.68E-08 |
| (Ohm*mil) | 6.61E-04 |
| | |
| Tab Width | 69 |
| Slot Width (mils) | 30 |
| | |
| | |
| | |
| | |
| Area (square mils) | 2070 |
| Tab Length | 15 |
| | |
| Resistance (ohms) = | 4.79E-06 |
| | |
| | |
| Copper Thermal Conductivity (W/m*K) = | 386 |
| Copper Thermal Conductivity (W/mil*K) = | 0.009804 |
| | |
| Thermal Resistance (C/W) = | 0.74 |

| Via Calculation for Complete Via | |
|---|---|
| Plated Copper Resistivity | 1.90E-08 |
| Copper Resistivity (Ohm*mil) | 7.48E-04 |
| | |
| Via Inner Diameter (mils) | 12 |
| Via Minimum Plating (mils) | 1 |
| Outer Via Cross Sectional Area (square mils) | 153.86 |
| Inner Via Cross Sectional Area (square mils) | 113.04 |
| Via Cross Sectional Area (square mils) | 40.82 |
| Number of vias | 9 |
| Total Area (square mils) | 367.38 |
| Via Length (mils) = | 42 |
| | |
| Resistance (ohms) = | 8.55E-05 |
| | |
| | |
| Copper Thermal Conductivity (W/m*K) = | 386 |
| Copper Thermal Conductivity (W/mil*K) = | 0.009804 |
| | |
| Thermal Resistance (C/W) = | 11.66 |

| Via Calculation for Partial Via | |
| --- | --- |
| | |
| Plated Copper Resistivity | 1.90E-08 |
| Copper Resistivity (Ohm*mil) | 7.48E-04 |
| | |
| Via Inner Diameter (mils) | 12 |
| Via Minimum Plating (mils) | 1 |
| Outer Via Cross Sectional Area (square mils) | 153.86 |
| Inner Via Cross Sectional Area (square mils) | 113.04 |
| Via Cross Sectional Area (square mils) | 40.82 |
| Number of vias | 12 |
| Total Area (square mils) | 489.84 |
| Via Length (mils) = | 19 |
| | |
| Resistance (ohms) = | 2.90E-05 |
| | |
| | |
| Copper Thermal Conductivity (W/m*K) = | 386 |
| Copper Thermal Conductivity (W/mil*K) = | 0.009804 |
| | |
| Thermal Resistance (C/W) = | 3.96 |

FIG. 29

PRINTED CIRCUIT BOARDS WITH PLATED BLIND SLOTS FOR IMPROVED VERTICAL ELECTRICAL AND/OR THERMAL CONNECTIONS

BACKGROUND

The field of the disclosure relates to printed circuit boards (PCBs), and more particularly, to PCBs that utilize plated blind slots with electrical and/or thermal connections.

PCBs include a plurality of conductive traces formed from one or more conductive layers to provide an electrical connection between components mounted to the PCBs. Some PCBs have multiple conductive layers, including inner conductive layers and outer conductive layers. Additionally, some PCBs include conductive vias that electrically couple two or more of the conductive layers together. A blind via connects an outer conductive layer to in inner conductive layer, while a buried via connects two inner conductive layers. Further, some PCBs include plated blind slots, which may be used to secure components in place during reflow (e.g., to secure inductors in place on the PCB that include electrical tabs that extend into the plated blind slots).

In some cases, it may be desirable to provide an electrical and/or a thermal pathway from a plated blind slot to an opposing side of the PCB depending on the implementation. For example, if the PCB is used as the substrate for a DC-DC converter module and the plated blind slots are electrically connected to power devices (e.g., inductors), then it may be desirable to provide an electrical pathway and/or a thermal pathway from the plated blind slots on the PCB to an opposing side of the PCB, when the opposing side of the PCB is configured to mount (e.g., with land grid array pads) to another PCB (e.g., the DC-DC converter module forms one of the components of the other PCB).

Problems arise, however, when attempting to electrically and/or thermally connect the plated blind slots to the opposing side of the PCB using vias. Typically, a plurality of buried and/or blind vias are arranged between the opposing side of the PCB and the plated blind slot. However, the milling process used to fabricate the blind slot is subject to mechanical tolerances in depth, meaning that it is difficult to ensure that the bottom of the slot is proximate to the buried/blind vias arranged between the bottom of the slot and the opposing side of the PCB.

Thus, it is desirable to improve the electrical and/or thermal connections between plated blind slots on PCBs and the opposing side of the PCBs.

BRIEF DESCRIPTION

In one aspect, a PCB is provided. The PCB includes at least one insulating layer, a blind slot, and at least one via. The at least one insulating layer includes a first surface and a second surface opposite the first surface. The blind slot is plated and formed in the at least one insulating layer, where the blind slot partially extends from the first surface to the second surface, and where the blind slot includes a conductive plating bonded along a major surface of the blind slot. The at least one via is electrically conductive and filled, where the at least one via is coupled with and extends between the conductive plating of the blind slot and the second surface of the at least one insulating layer.

In another aspect, a method of fabricating a PCB is provided. The method includes fabricating at least one electrically conductive via in at least one insulating layer, wherein the at least one electrically conductive via extends between a first surface of the at least one insulating layer and a second surface of the at least one insulating layer opposite the first surface, and filling the at least one electrically conductive via. The method further includes performing a removal process on the first surface of the at least one insulating layer to form a blind slot that partially extends from the first surface towards the second surface, where the removal process removes a first portion of the at least one electrically conductive via as-filled and forms a major surface of the blind slot. The method further includes bonding a conductive plating along the major surface of the blind slot, where the conductive plating electrically couples to a second portion of the at least one electrically conductive via.

In another aspect, a PCB is provided. The PCB includes at least one insulating layer including a first major surface and a second major surface opposite the first major surface. The PCB further includes a blind slot formed in the at least one insulating layer, where the blind slot partially extends from the first major surface towards the second major surface. The blind slot includes sidewalls extending between the first major surface and the second major surface and a bottom extending between the sidewalls. The PCB further includes a first conductive layer disposed on the bottom and the sidewalls of the blind slot, and a second conductive layer disposed on at least a portion of the second major surface of the at least one insulating layer. The PCB further includes a plurality of vias that are electrically conductive and filled, where the plurality of vias are electrically coupled with and extend between the first conductive layer disposed on the bottom of the blind slot and the second conductive layer disposed on the second major surface, and where the plurality of vias include at least one buried via electrically coupled with at least one blind via.

DRAWINGS

These and other features, aspects, and advantages of the present disclosure will become better understood when the following detailed description is read with reference to the accompanying drawings in which like characters represent like parts throughout the drawings, wherein:

FIGS. 26-29 depict various calculation tables used to calculate the results of one or more of the thermal resistance models of FIGS. 21 and 23 and/or the electrical resistance models of FIGS. 24-25 in example embodiments.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Figure 1:
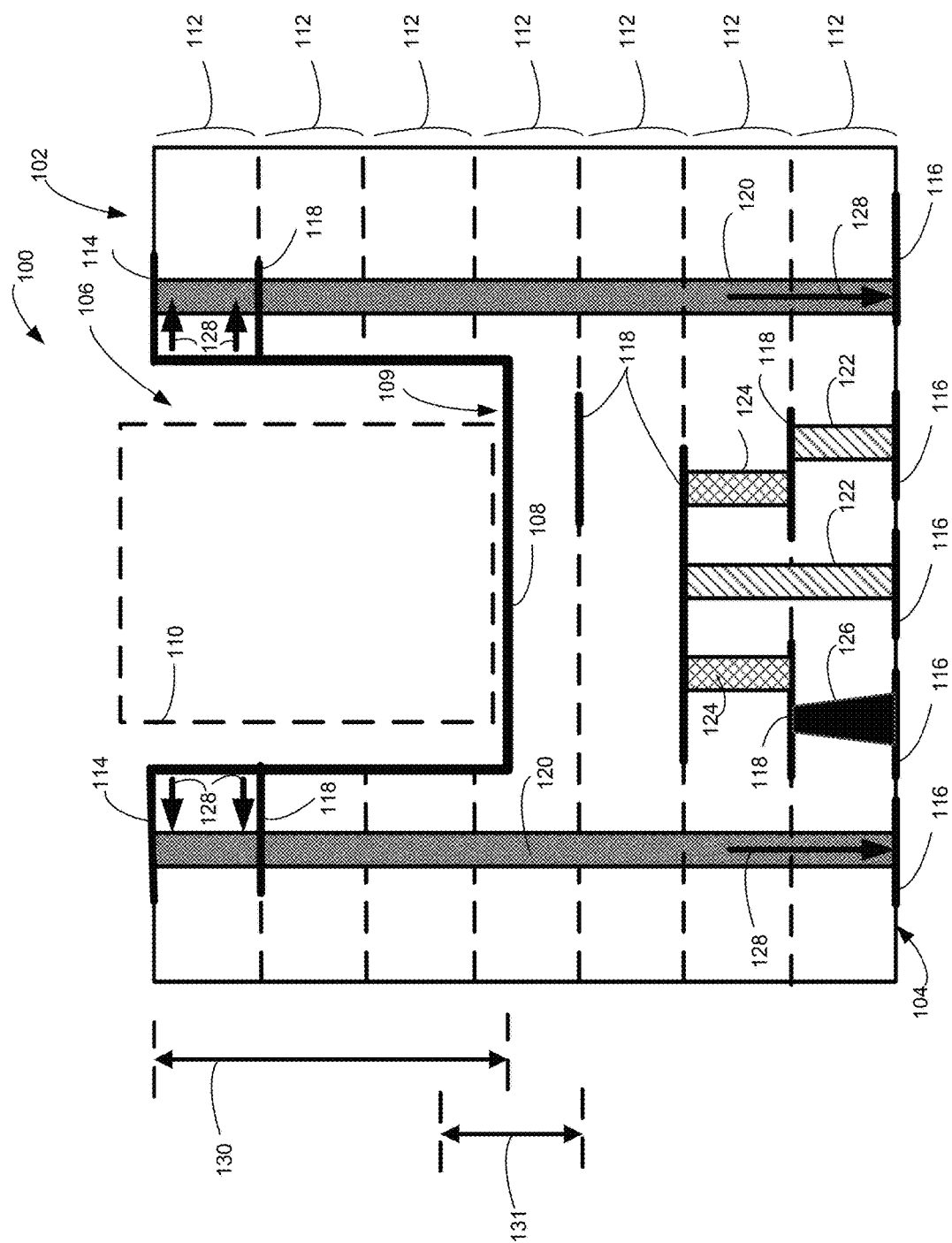
FIG. 1 depicts a cross-section of a known PCB depicting a blind slot that is plated.

FIG. 1 depicts a cross-section of a known PCB 100 having outer surfaces 102, 104 that oppose each other. A portion of outer surface 102 has been milled and/or drilled and plated in FIG. 1 to form a blind slot 106, which includes an electrically conductive plating 108 applied thereto. Blind slot 106, for example, may be used to secure a tab 110 of a component (e.g., an electrical contact of an inductor) during a reflow process when components are assembled onto outer surface 102 (e.g., blind slot 106 may have solder paste applied thereto (not shown), which melts during reflow and forms a solder joint between tab 110 and electrically conductive plating 108). Blind slot 106 may also be referred to as blind hole in some embodiments.

In FIG. 1, PCB 100 is formed from a plurality of substrates 112 that are electrical insulators, and conductive layers 114, 116, 118, all of which are laminated together. Substrates 112 may include various materials including FR-4, which is a fiberglass reinforced epoxy laminate.

PCB 100 in FIG. 1 includes a number of electrically conductive layers, including outer conductive layers 114, 116 at outer surfaces 102, 104, respectively, and inner conductive layers 118. Conductive layers 114, 116, 118 may be patterned as desired to route electrical signals, power, and ground through PCB 100. In FIG. 1, PCB 100 includes a number of electrically conductive vias 120, 122, 124, 126, which provide electrical connections between different layers of PCB 100. In FIG. 1, PCB 100 includes through-hole vias 120, which form electrical connections between conductive layers 114, 116, 118, blind vias 122, which form electrical connections between outer conductive layers 114, 116 and inner conductive layers 118, buried vias 124 which form electrical connections between inner conductive layers 118, and microvias 126, which are blind/buried structures that are laser drilled with specific size/aspect ratio constraints (e.g., maximum diameter limitations and/or maximum aspect ratio limitations).

Through-hole vias 120 are generally formed by performing a drilling process between outer surfaces 102, 104 after final lamination, which are then plated and filled. Typically, blind vias 122 are formed after final lamination using controlled depth drilling using a laser or mechanical drill at outer surfaces 102, 104, which are then plated. The result of the various processes used to form blind vias 122, buried vias 124, and microvias 126 is that not all layer combinations are possible. For example, it is typically desired that PCB 100 have three or fewer lamination steps during assembly, and different combinations of blind vias 122, buried vias 124, and microvias 126 may require more than three lamination steps.

In some cases, it may be desirable to provide a current path from blind slot 106 to outer surface 104, depending on the implementation. For example, if tab 110 is electrically connected to a power device, such as an inductor, it may be desirable to provide a current path vertically in FIG. 1 from electrically conductive plating 108 in blind slot 106 to outer surface 104, to allow an electrical connection to outer conductive layer 116. Typically, this is implemented using one or more through-hole vias 120, which are located proximate to blind slot 106 as depicted in FIG. 1. In this implementation, a current and/or thermal path 128 generally begins at electrically conductive plating 108 of blind slot 106, extends along outer conductive layer 114 and inner conductive layers 118 near the top of FIG. 1, and extends downward along through-hole vias 120 in FIG. 1. However, this configuration is less than ideal for a number of reasons. One reason is that current and/or thermal path 128 is not directly vertical in FIG. 1, which increases the path length and therefore, the electrical and/or thermal impedance between tab 110 and outer conductive layer 116 of PCB 100. Although one possible solution may be to utilize combinations of blind vias 122, buried vias 124, and/or microvias 126 between electrically conductive plating 108 of blind slot 106 and outer surface 104 of PCB 100, variations in a milling depth 130 used when fabricating blind slot 106 in substrates 112 may make it difficult to ensure that vias formed below blind slot 106 (e.g., between electrically conductive plating 108 and outer surface 104) make electrical and/or thermal connections with electrically conductive plating 108. For example, the bottom 109 of blind slot 106 may vary in FIG. 1 over a tolerance 131, which makes it difficult to ensure that bottom 109 of blind slot 106 makes electrical and/or thermal connections with vias formed below blind slot 106. Further, various combinations of blind vias 122, buried vias 124, and/or microvias 126 may necessitate additional lamination steps, which may reduce the reliability in PCB 100 or may be cost prohibitive.

In the embodiments described herein, via structures are fabricated that extend through one or more of the insulating layers of a PCB, and a portion of the via structures are milled and/or drilled away when fabricating a blind slot for the PCB. A conductive plating is applied to the blind slot, which electrically and/or thermally couples the blind slot to the portion of the via structures that remain after milling and/or drilling. The result is a blind slot that connects both electrically and/or thermally in a vertical direction with the outer surface of the PCB opposing the blind slot, thereby improving the electrical and/or thermal conductivity between the blind slot and the outer surface of the PCB. Milling and/or drilling away a portion of the via structures when fabricating the blind slot also mitigates problems associated with the variations in the depth of the blind slot that arise due to tolerance issues.

Figure 2:
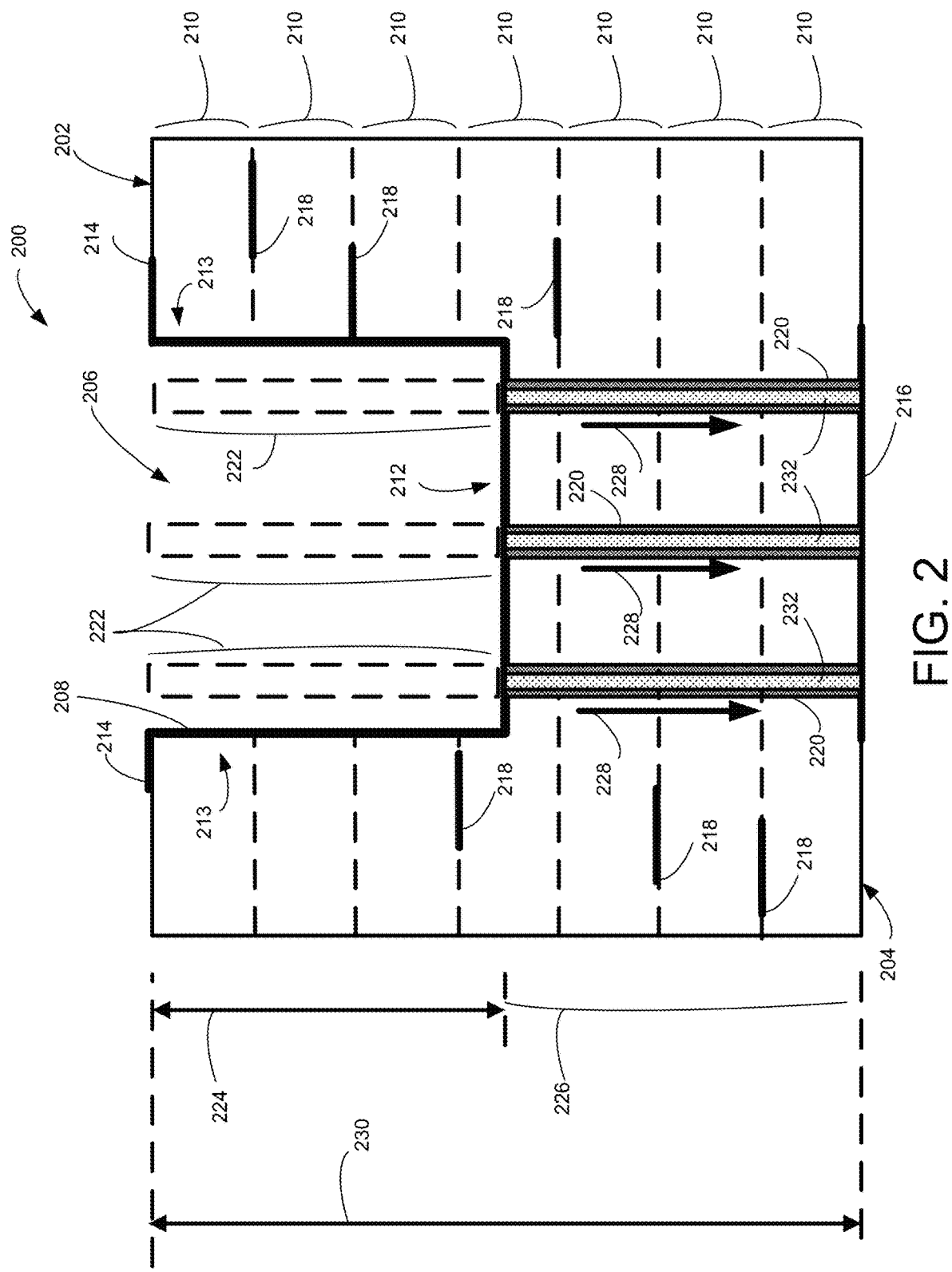
FIG. 2 depicts a cross-section of a PCB that utilizes a plated blind slot that is electrically and/or thermally coupled to through-hole vias in an example embodiment.

FIG. 2 depicts a cross-section of a PCB 200 in an example embodiment. In this embodiment, PCB 200 includes a first outer surface 202 and a second outer surface 204 that oppose each other and are separated by a width 230 of PCB 200. First outer surface 202 has been milled and/or drilled and plated in FIG. 2 to form a blind slot 206, which includes an electrically conductive plating 208 bonded along a major surface 212 and sidewalls 213 of blind slot 206. Blind slot 206 may be referred to as a blind hole in some embodiments.

Major surface 212 is substantially parallel to outer surface 202, and sidewalls 213 are substantially perpendicular to outer surface 202 (e.g., sidewalls 213 extend between outer surfaces 202, 204) in some embodiments. In other embodiments, major surface 212 has a non-planar shape that depends on how material is removed from first outer surface 202 when fabricating blind slot 206.

Electrically conductive plating 208 of blind slot 206 may, for example, be used to secure a tab of a component, not shown (e.g., a tab for an inductor) during a reflow process when components are assembled onto first outer surface 202 (e.g., blind slot 206 may have solder paste added thereto (not shown), which melts during reflow and forms a solder joint between the tab and electrically conductive plating 208). Blind slot 206 in this embodiment partially extends from first outer surface 202 towards second outer surface 204.

In this embodiment, PCB 200 is formed from one or more insulating layers 210 and conductive layers 214, 216, 218 that are laminated together. Insulating layers 210 may include various materials including FR-4, which is a fiberglass reinforced epoxy laminate. The number of insulating layers 210 depicted for PCB 200 are illustrative only for purposes of discussion, and PCB 200 may have fewer or more insulating layers 210 in other embodiments.

PCB 200 in FIG. 2 includes a number of electrically conductive layers 214, 216, 218, including outer conductive layers 214, 216 at outer surfaces 202, 204, respectively, and inner conductive layers 218 between outer surfaces 202, 204. Conductive layers 214, 216, 218 may be patterned as desired to route electrical signals, power, and ground through PCB 200. In this embodiment, PCB 200 includes one or more through-hole vias 220, which are filled with a material 232. Material 232 is used to prevent solder paste applied within blind slot 206 from wicking away from blind slot 206 within through-hole vias 220 towards second outer surface 204 during reflow when the solder paste melts. Having through-hole vias 220 unfilled may also generate solder bumps on second outer surface 204 where through-hole vias 220 intersect second outer surface 204, which may cause problems when PCB 200 is mounted to a second PCB during manufacturing. For example, when PCB 200 is used for a DC-DC converter module, and the DC-DC converter module is surface mounted (along second outer surface 204) to another main PCB, then the solder bumps would be both undesirable and uncontrolled.

Material 232 used to fill through-hole vias 220 includes epoxy, solder mask, and/or copper, in different embodiments. Through-hole vias 220 extend vertically in FIG. 2 between major surface 212 of blind slot 206 and second outer surface 204. In this embodiment, a first portion 222 of through-hole vias 220 has been milled and/or drilled away during a removal process used to form blind slot 206, resulting in the pre-fabricated structure of through-hole vias 220 being transected by major surface 212 of blind slot 206. The discontinuation generated by milling and/or drilling first portion 222 of through-hole vias 220 away may be observable based on distortions in the pre-fabricated structure of through-hole vias 220 proximate to the intersection of through-hole vias 220 and major surface 212 of blind slot 206.

First portion 222 of through-hole vias 220 milled and/or drilled away during fabrication may correspond to about a depth 224 of blind slot 206. In the configuration depicted in FIG. 2, electrically conductive plating 208 and a second portion 226 of through-hole vias 220 electrically and/or thermally couples electrically conductive plating 208 of blind slot 206 with outer conductive layer 216 of second outer surface 204 of PCB 200, providing an electrical and/or thermal conduction path 228 that is substantially vertical through PCB 200.

Figure 3:
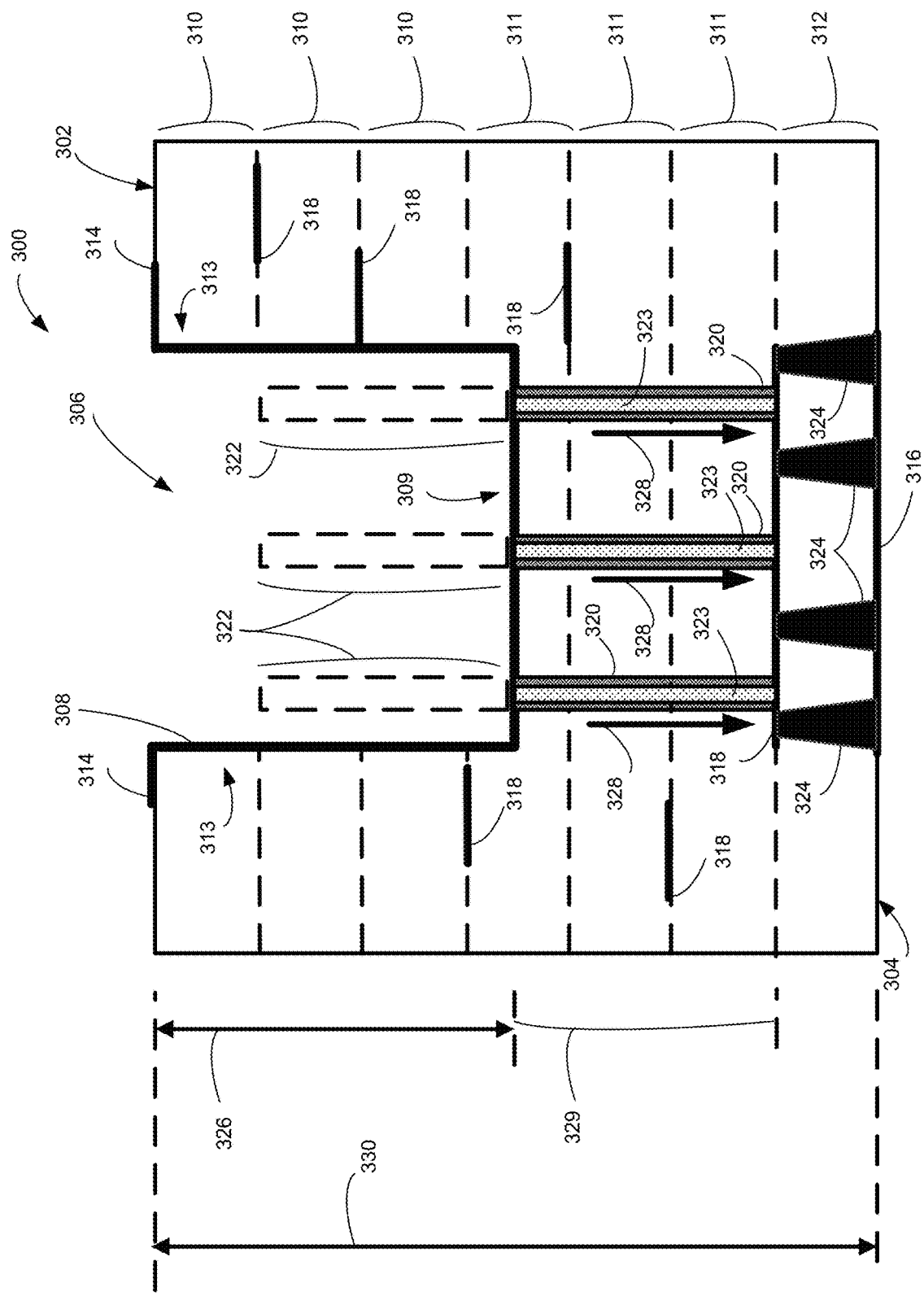
FIG. 3 depicts a cross-section of a PCB that utilizes a plated blind slot that is electrically and/or thermally coupled to blind and buried vias in an example embodiment.

FIG. 3 depicts a cross-section of a PCB 300 in another example embodiment. In this embodiment, PCB 300 includes a first outer surface 302 and a second outer surface 304 that oppose each other and are separated by a width 330 of PCB 300. First outer surface 302 has been milled and/or drilled and plated in FIG. 3 to form a blind slot 306, which includes an electrically conductive plating 308 bonded along a major surface 309 and sidewalls 313 of blind slot 306. Blind slot 306 may be referred to as a blind hole in some embodiments.

Major surface 309 is substantially parallel to first outer surface 302, and sidewalls 313 are substantially perpendicular to first outer surface 302 (e.g., sidewalls 313 extend between outer surfaces 302, 304) in some embodiments. In other embodiments, major surface 309 has a non-planar shape that depends on how material is removed from first outer surface 302 when fabricating blind slot 306.

Electrically conductive plating 308 of blind slot 306 may, for example, be used to secure a tab of a component. Blind slot 306 in this embodiment partially extends from first outer surface 302 towards second outer surface 304.

In this embodiment, PCB 300 is formed from one or more insulating layers 310, 311, 312 and conductive layers 314, 316, 318 that are laminated together. Insulating layers 310, 311, 312 may include various materials including FR-4, discussed previously. The number of insulating layers 310, 311, 312 depicted for PCB 300 are illustrative only for purposes of discussion, and PCB 300 may have fewer or more insulating layers 310, 311, 312 in other embodiments.

PCB 300 in FIG. 3 includes a number of electrically conductive layers 314, 316, 318, including outer conductive layers 314, 316 at outer surfaces 302, 304, respectively, and inner conductive layers 318 between outer surfaces 302, 304. Conductive layers 314, 316, 318 may be patterned as desired to route electrical signals, power, and ground through PCB 300. In this embodiment, PCB 300 includes one or more buried vias 320, which are filled with a material 323. Buried vias 320 may be filled with material 323 for similar reasons as previously described for through-hole vias 220 of FIG. 2.

Material 323 includes epoxy, solder mask, and/or copper in different embodiments. Buried vias 320 extend vertically in FIG. 3 within insulating layers 311 of PCB 300 and are electrically and/or thermally coupled to one or more blind vias 324 formed in insulating layer 312 proximate to second outer surface 304.

In this embodiment, a first portion 322 of buried vias 320 have been milled and/or drilled away during a process used to form blind slot 306, resulting in the pre-fabricated structure of buried vias 320 being transected by major surface 309 of blind slot 306. The discontinuation generated by milling and/or drilling first portion 322 of buried vias 320 away may be observable based on distortions in the pre-fabricated structure of buried vias 320 proximate to the intersection of buried vias 320 and major surface 309 of blind slot 306.

First portion 322 of buried vias 320 milled and/or drilled away during fabrication may correspond to about a depth 326 of blind slot 306. In the configuration depicted in FIG. 3, electrically conductive plating 308 and a second portion 329 of buried vias 320 electrically and/or thermally couple electrically conductive plating 308 of blind slot 306 with outer conductive layer 316 of second outer surface 304 of PCB 300 using blind vias 324, providing an electrical and/or thermal conduction path 328 that is substantially vertical through PCB 300.

Figure 4:
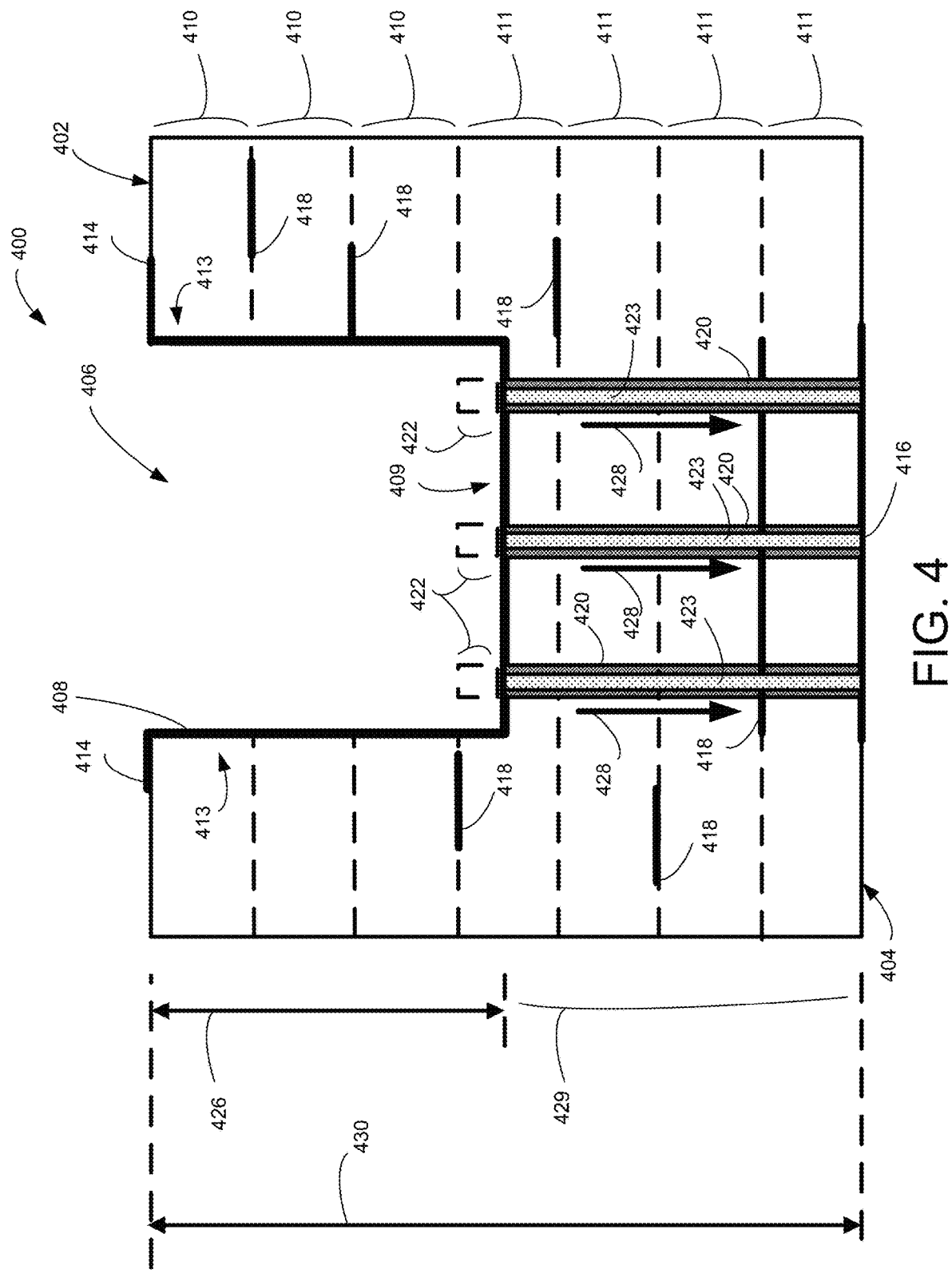
FIG. 4 depicts a cross-section of a PCB that utilizes a plated blind slot that is electrically and/or thermally coupled to blind vias in an example embodiment.

FIG. 4 depicts a cross-section of a PCB 400 in another example embodiment. In this embodiment, PCB 400 includes a first outer surface 402 and a second outer surface 404 that oppose each other and are separated by a width 430 of PCB 400. First outer surface 402 has been milled and/or drilled and plated in FIG. 4 to form a blind slot 406, which includes an electrically conductive plating 408 bonded along a major surface 409 and sidewalls 413 of blind slot 406. Blind slot 406 may be referred to as a blind hole in some embodiments.

Major surface 409 is substantially parallel to first outer surface 402, and sidewalls 413 are substantially perpendicular to first outer surface 402 (e.g., sidewalls 413 extend between outer surfaces 402, 404) in some embodiments. In other embodiments, major surface 409 has a non-planar shape that depends on how material is removed from first outer surface 402 when fabricating blind slot 406.

Electrically conductive plating 408 of blind slot 406 may, for example, be used to secure a tab of a component. Blind slot 406 in this embodiment partially extends from first outer surface 402 towards second outer surface 404.

In this embodiment, PCB 400 is formed from one or more insulating layers 410, 411 and conductive layers 414, 416, 418 that are laminated together. Insulating layers 410, 411 may include various materials including FR-4, discussed previously. The number of insulating layers 410, 411 depicted for PCB 400 are illustrative only for purposes of discussion, and PCB 400 may have fewer or more insulating layers 410, 411 in other embodiments.

PCB 400 in FIG. 4 includes a number of electrically conductive layers 414, 416, 418, including outer conductive layers 414, 416 at outer surfaces 402, 404, respectively, and inner conductive layers 418 between outer surfaces 402, 404. Conductive layers 414, 416, 418 may be patterned as desired to route electrical signals, power, and ground through PCB 400. In this embodiment, PCB 400 includes one or more blind vias 420, which are filled with a material 423. Blind vias 420 may be filled with material 423 for similar reasons as previously described for through-hole vias 220 of FIG. 2.

Material 423 includes epoxy, solder mask, and/or copper in different embodiments. Blind vias 420 extend vertically in FIG. 4 within insulating layers 411 of PCB 400 and are electrically and/or thermally coupled to outer conductive layer 416 at second outer surface 404.

In this embodiment, a first portion 422 of blind vias 420 have been milled and/or drilled away during a process used to form blind slot 406, resulting in the pre-fabricated structure of blind vias 420 being transected by major surface 409 of blind slot 406. The discontinuation generated by milling and/or drilling first portion 422 of blind vias 420 away may be observable based on distortions in the pre-fabricated structure of blind vias 420 proximate to the intersection of blind vias 420 and major surface 409 of blind slot 406.

First portion 422 of blind vias 420 milled and/or drilled away during fabrication may correspond to about a depth 426 of blind slot 406. In the configuration depicted in FIG. 4, electrically conductive plating 408 and a second portion 429 of blind vias 420 electrically and/or thermally couple electrically conductive plating 408 of blind slot 406 with outer conductive layer 416 of second outer surface 404 of PCB 400, providing an electrical and/or thermal conduction path 428 that is substantially vertical through PCB 400.

Figure 5:
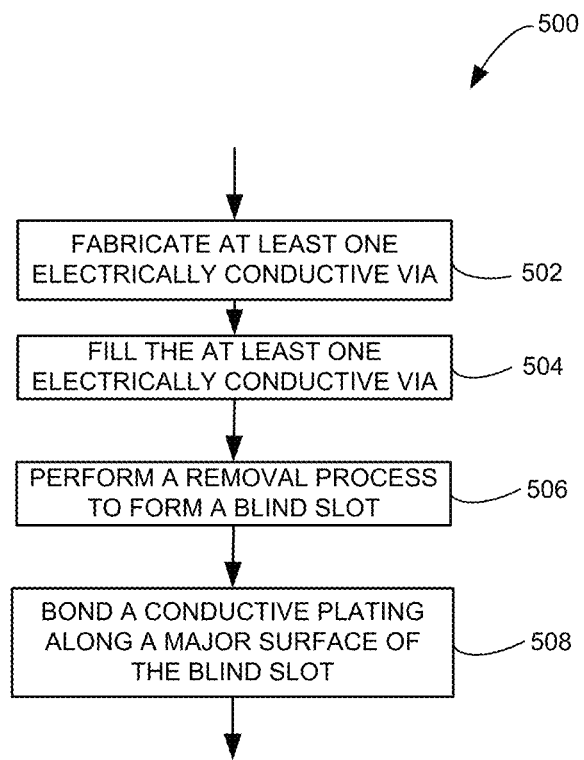
FIG. 5 is a method of fabricating PCBs in an example embodiment.

FIG. 5 is a method 500 of fabricating a PCB in an example embodiment. Although method 500 will be discussed with respect to the PCBs 200, 300, 400, those of skill in the art will appreciate that method 500 may apply to other PCBs, not shown. The steps of method 500 are not all inclusive, and method 500 may include other steps, not shown. Further, the steps of method 500 may be performed in a different order.

Figure 6:
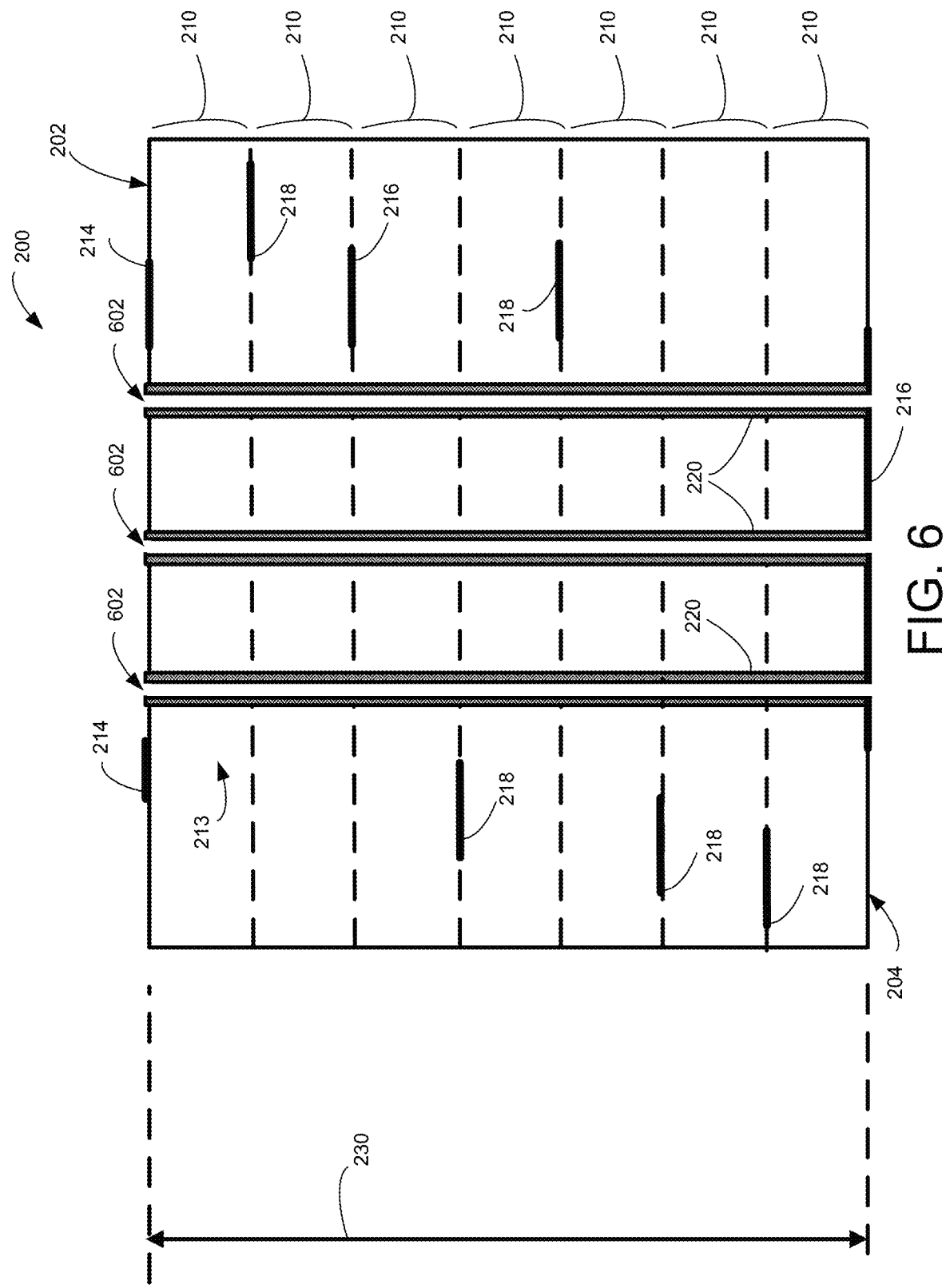
FIGS. 6-8 depict various stages in a process to fabricate the PCB of FIG. 2 according to the method of FIG. 5 in example embodiments.

Method 500 will first be discussed with respect to PCB 200 of FIG. 2. Fabricating PCB 200 according to method 500 begins by fabricating one or more conductive vias in one or more insulating layers (see step 502). Referring to FIG. 6, through-hole vias 220 are fabricated in PCB 200 by performing a drilling process after final lamination that generates holes 602 through insulating layers 210 between outer surfaces 202, 204. Holes 602 are then plated. At this intermediate stage of fabricating PCB 200, through-hole vias 220 extend completely between outer surfaces 202, 204.

Figure 7:
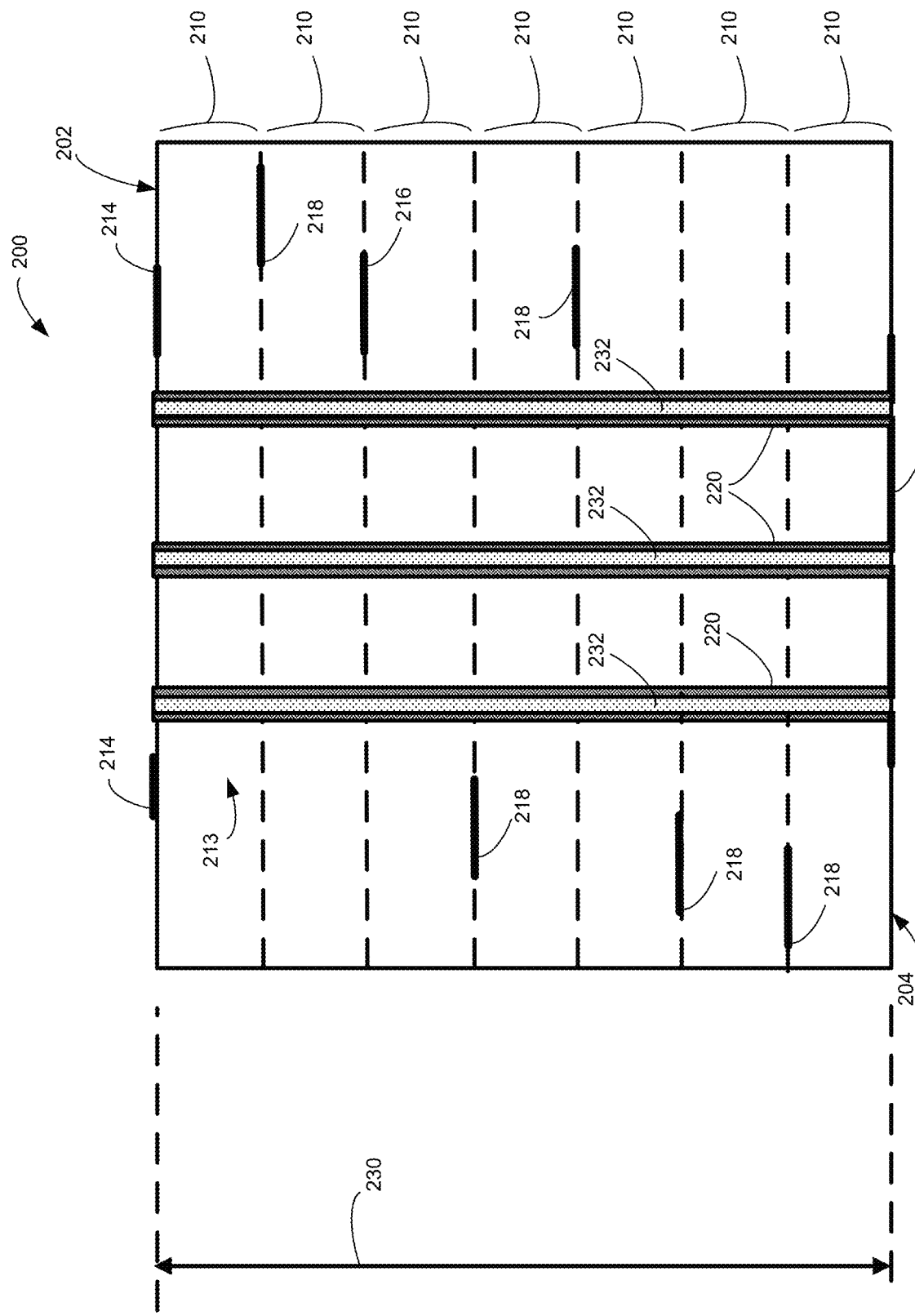

Fabricating PCB 200 according to method 500 continues by filling holes 602 of through-hole vias 220 with material 232 (see step 504). Referring to FIG. 7, the filling process applies material 232 within holes 602 of through-hole vias 220.

Figure 8:
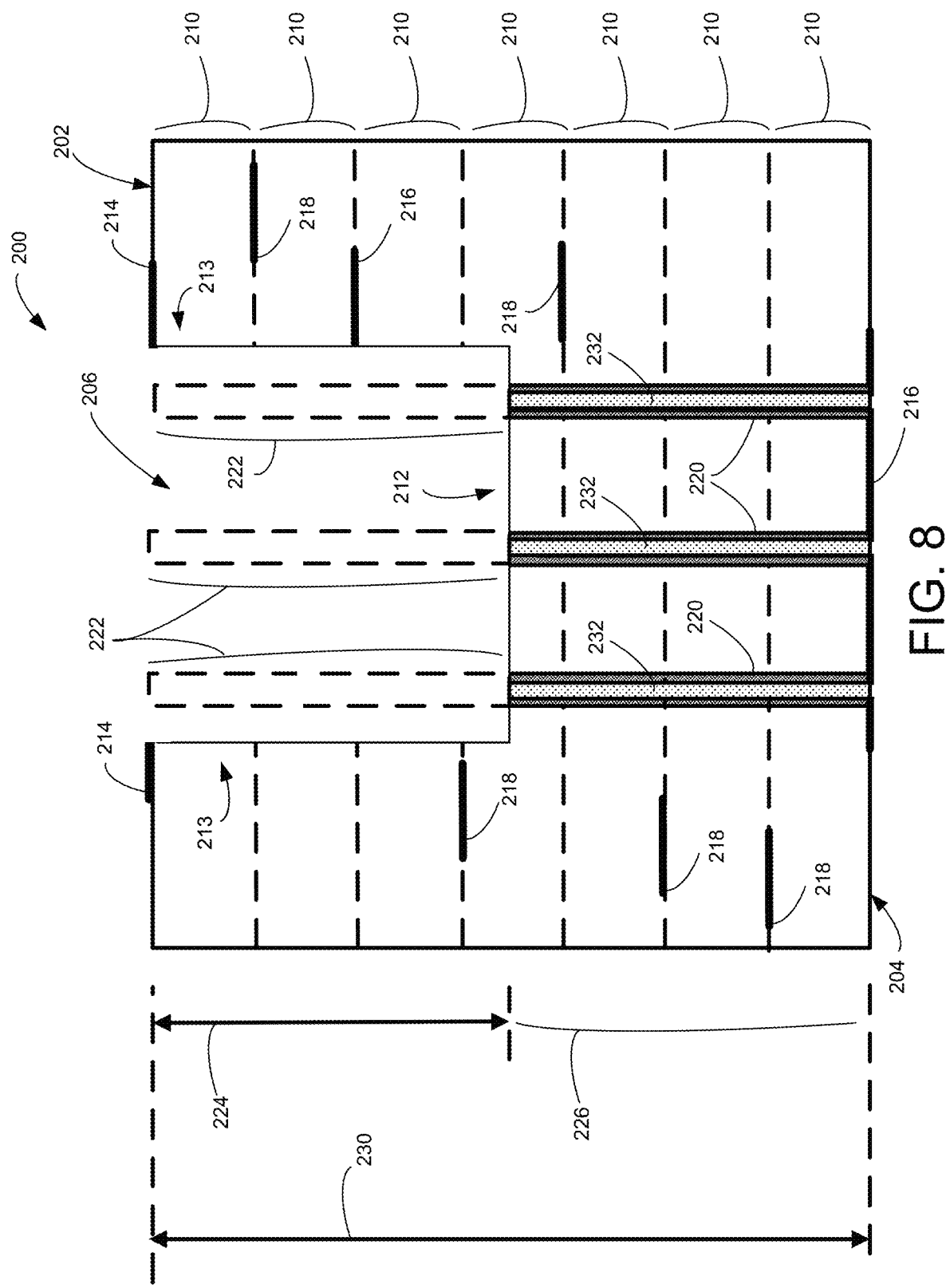
Figure 9:
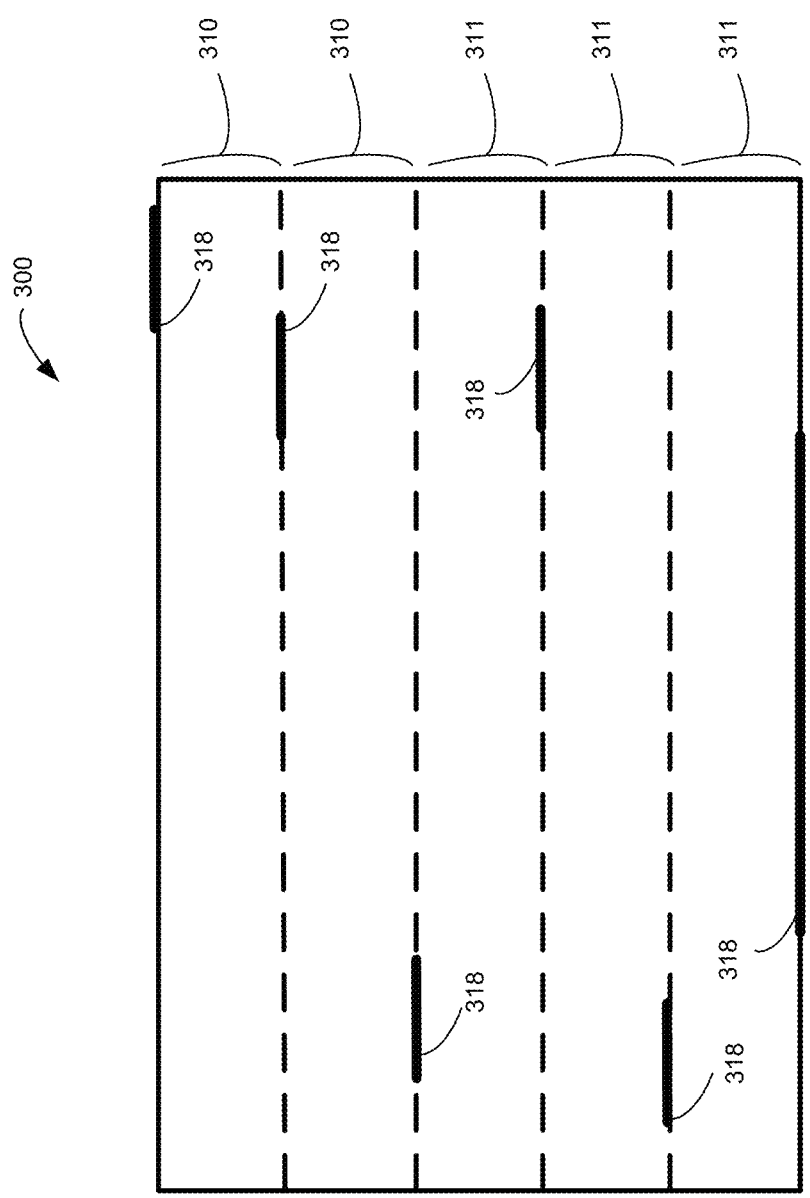
FIGS. 9-13 depict various stages in a process to fabricate the PCB of FIG. 3 according to the method of FIG. 5 in example embodiments.
Figure 10:
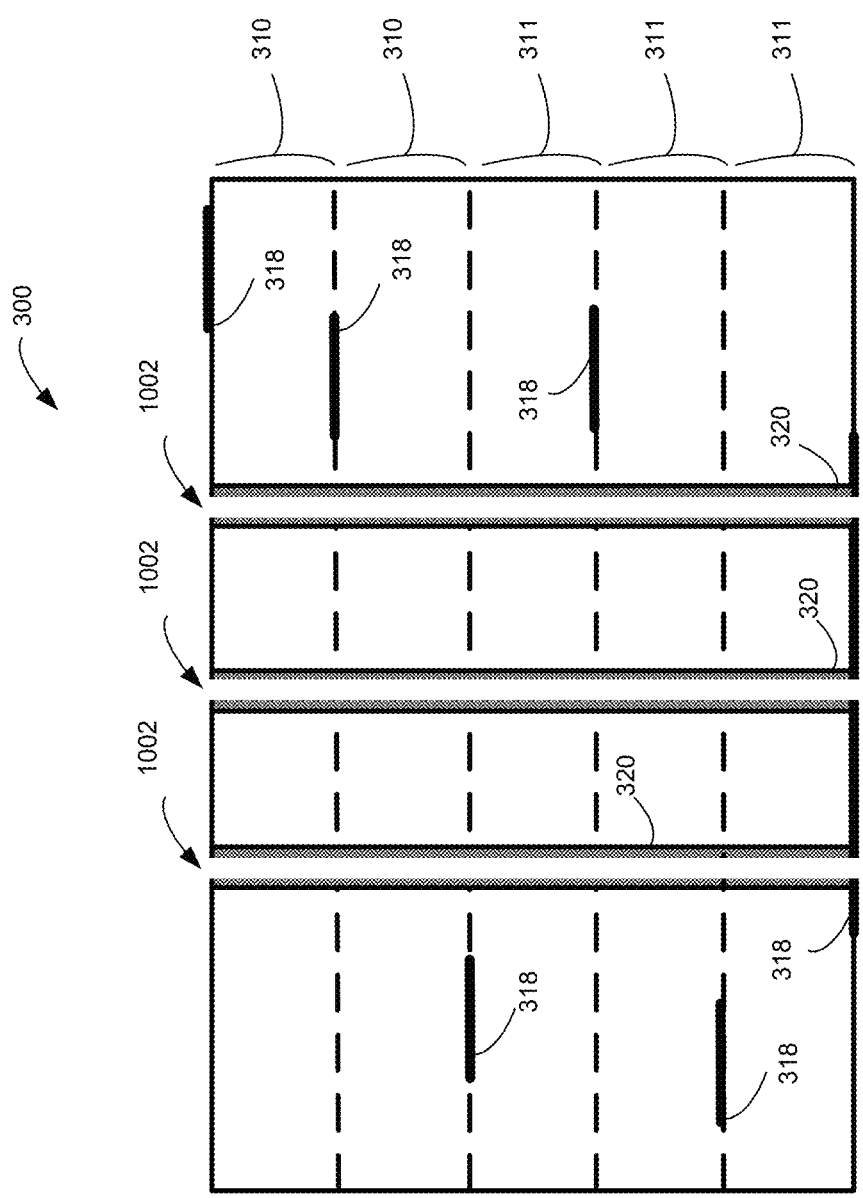
Figure 11:
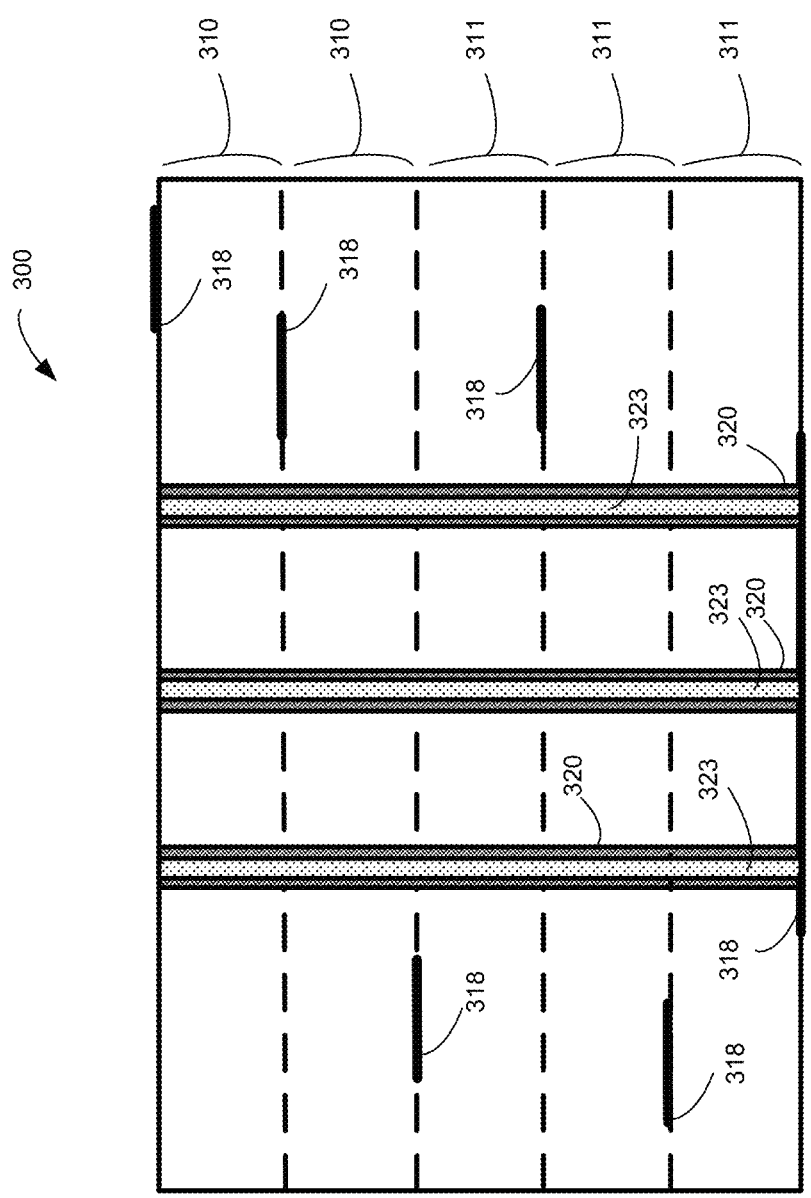
Figure 12:
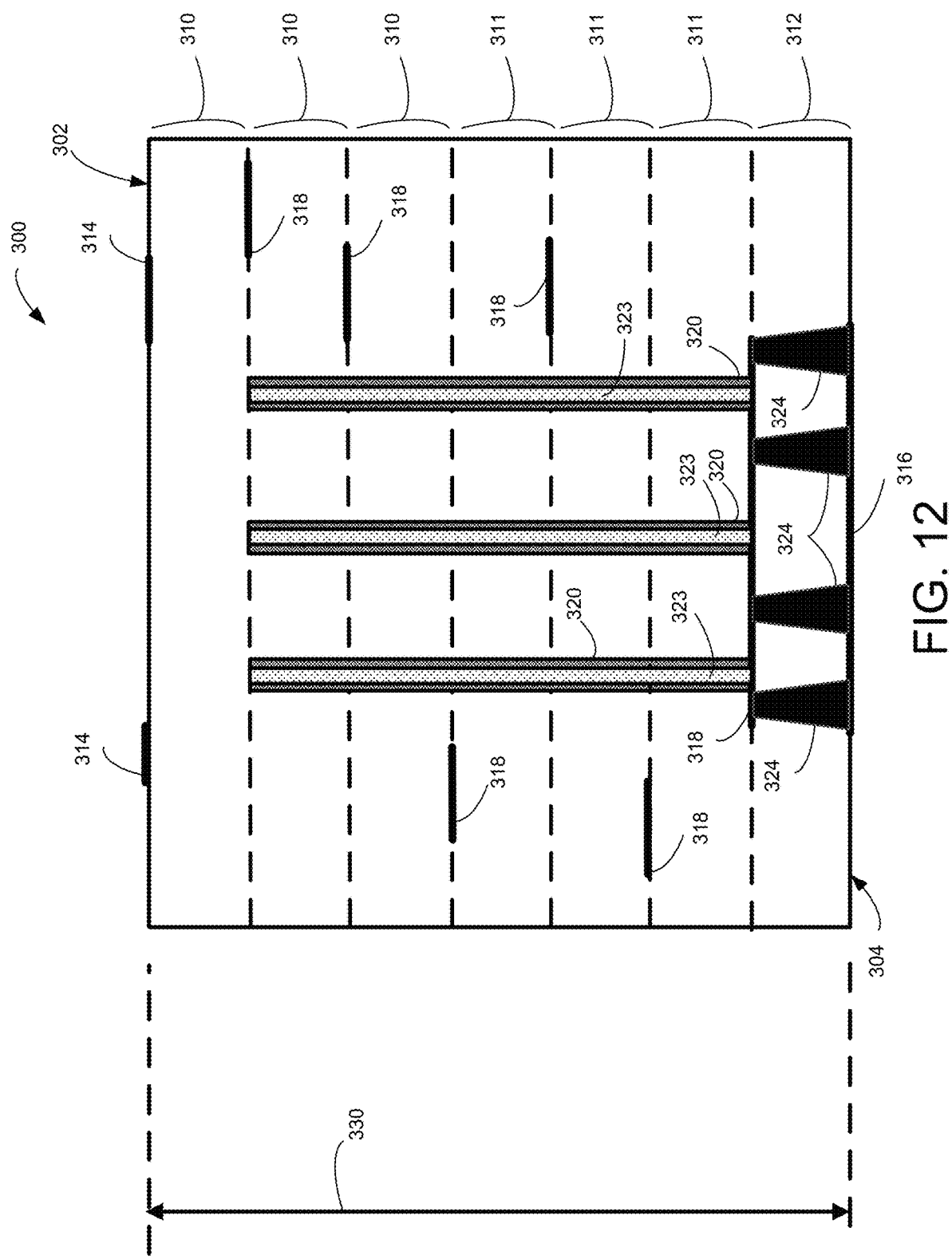

Fabricating PCB 200 according to method 500 continues by performing a milling and/or drilling process on first outer surface 202 to form blind slot 206 (see step 506). Referring to FIG. 8, the milling and/or drilling process removes first portion 222 of through-hole vias 220 to form blind slot 206, which has a depth 224. Second portion 226 of through-hole vias 220 remains after forming blind slot 206. Milling and/or drilling blind slot 206 also forms major surface 212 of blind slot 206.

Fabricating PCB 200 according to method 500 continues by bonding an electrically conductive plating to major surface 212 and sidewalls 213 of blind slot 206 (see step 508). Referring to FIG. 2, electrically conductive plating 208 is bonded to major surface 212 and sidewalls 213) to form blind slot 206. Electrically conductive plating 208 is electrically and/or thermally coupled to second portion 226 of through-hole vias 220 that remain after milling and/or drilling first outer surface 202 and is also electrically and/or thermally coupled to outer conductive layer 216 disposed on second outer surface 204 of PCB 200.

Method 500 will next be discussed with respect to PCB 300 of FIG. 3. Fabricating PCB 300 according to method 500 begins by fabricating one or more conductive vias in one or more insulating layers (see step 502). Referring to FIGS. 9-13, insulating layers 310, 311 and conductive layers 316 are laminated together (see FIG. 9), drilled and plated to form buried vias 320 (see FIG. 10, vias 320 will be buried after final lamination) having holes 1002. Holes 1002 are filled with material 323 (see step 504 and FIG. 11). Insulating layers 310, 311, 312 and conductive layers 314, 316, 318 are laminated together (see FIG. 12), and blind vias 324 are fabricated in second outer surface 304 that electrically connect buried vias 320 to outer conductive layer 316.

Figure 13:
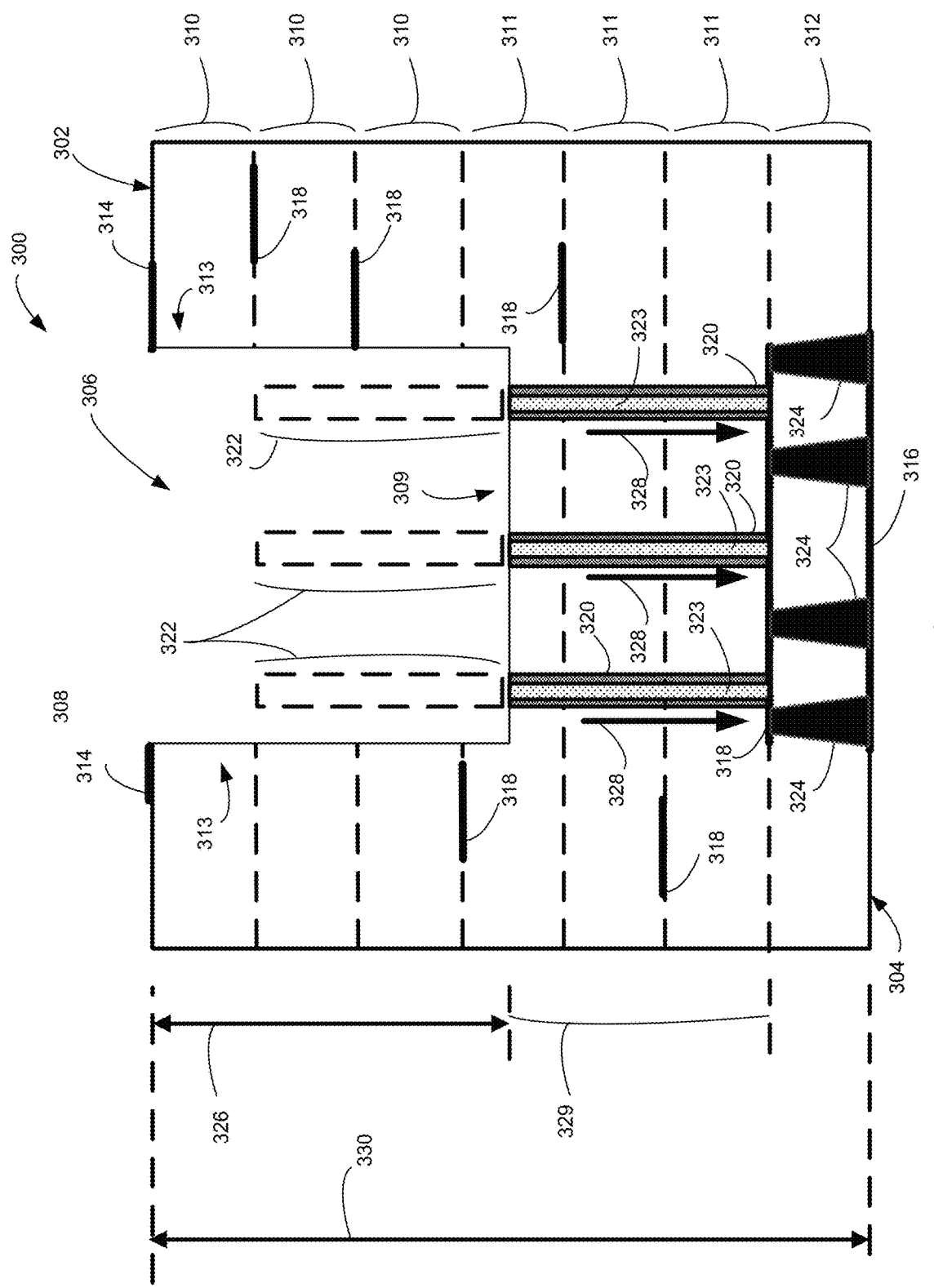
Figure 14:
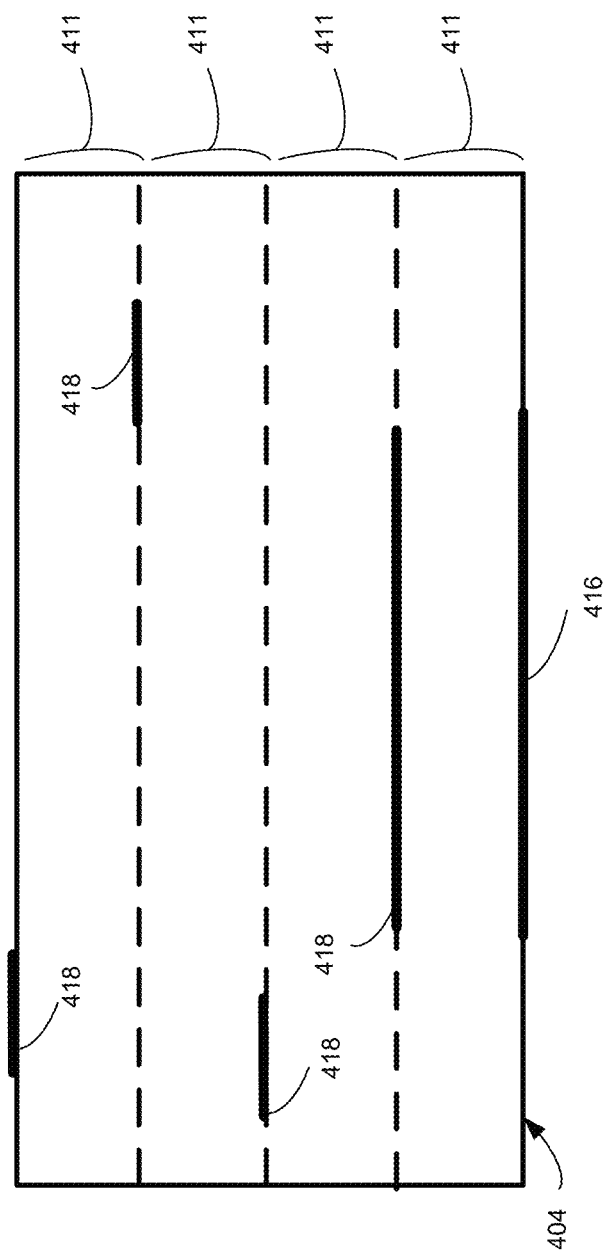
FIGS. 14-18 depict various stages in a process to fabricate the PCB of FIG. 4 according to the method of FIG. 5 in example embodiments.
Figure 15:
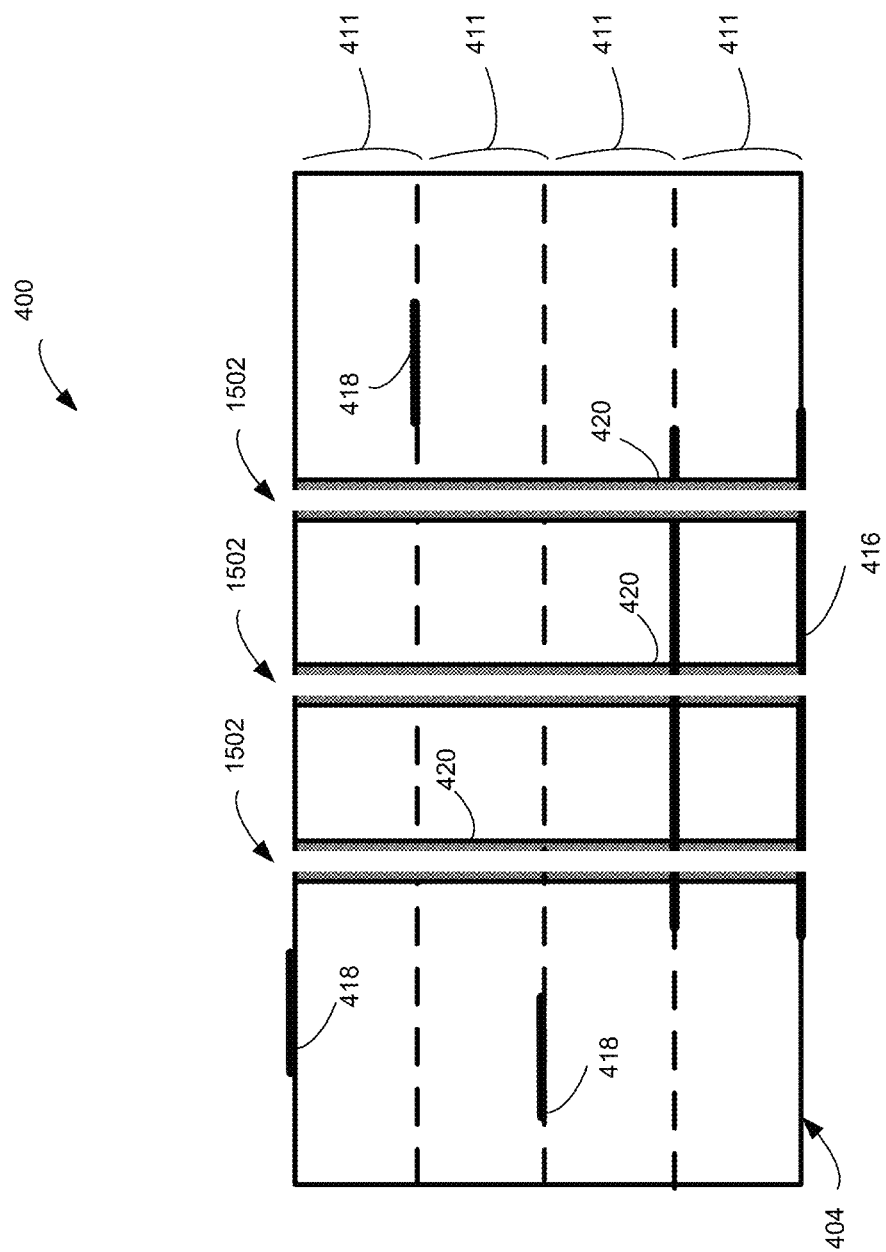
Figure 16:
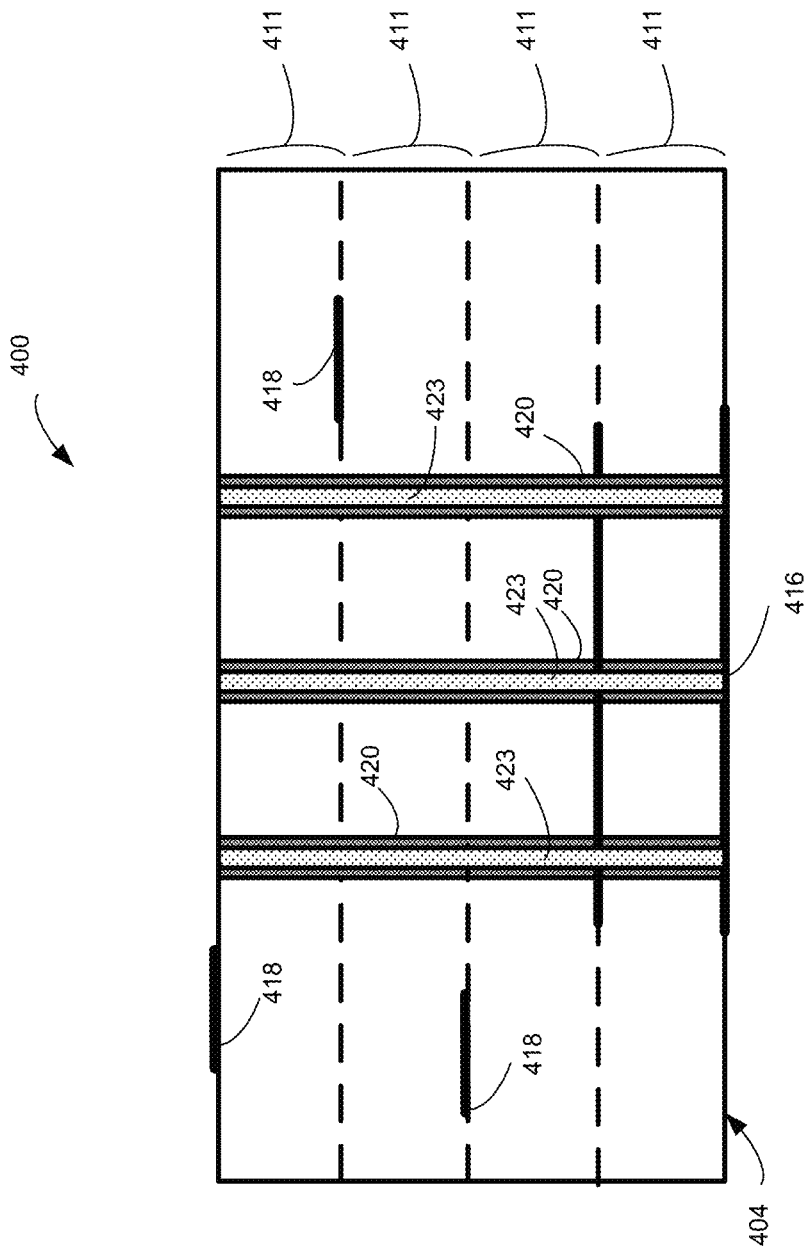
Figure 17:
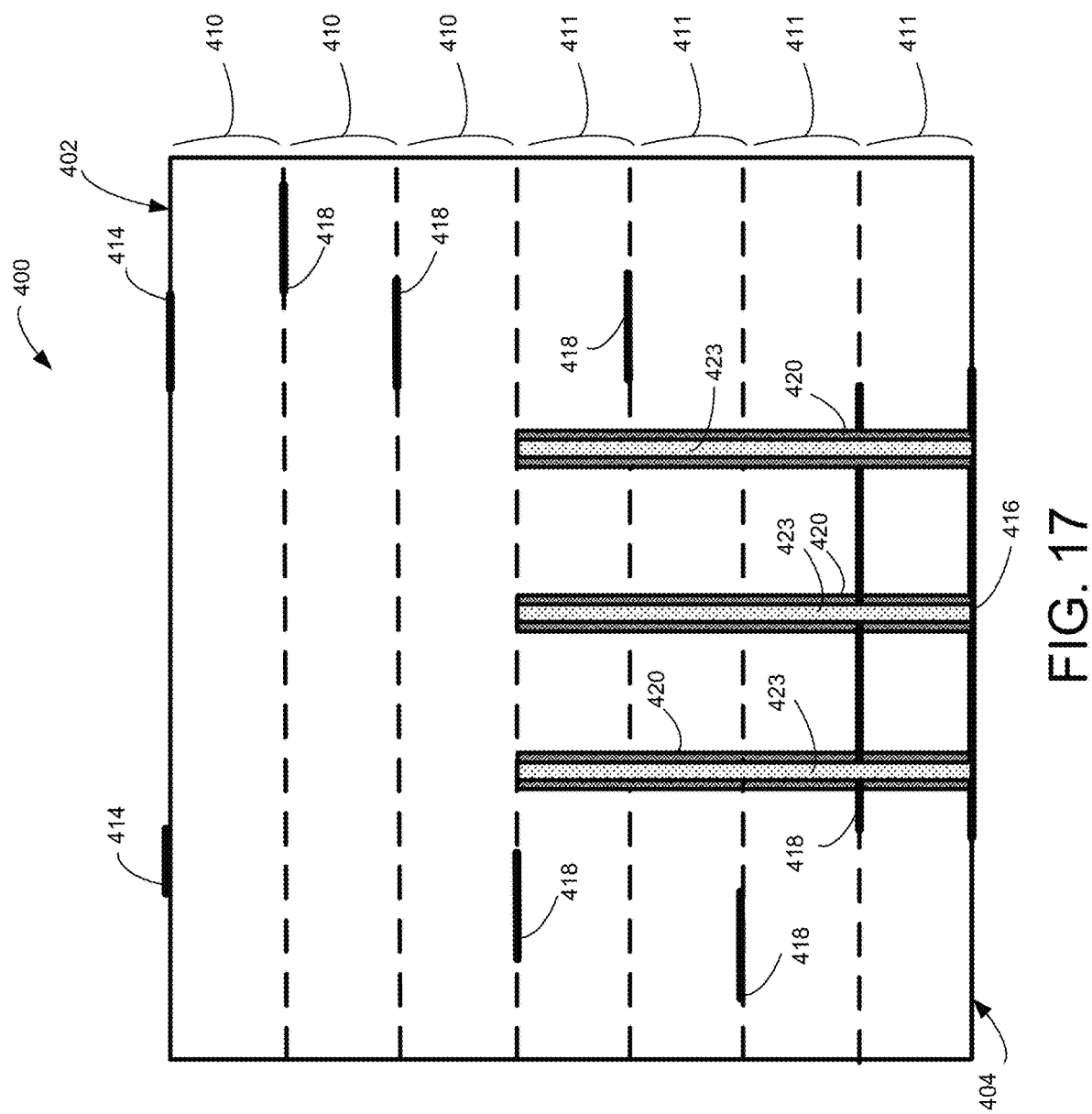

Fabricating PCB 300 according to method 500 continues by performing a milling and/or drilling process on first outer surface 302 to form a blind slot (see step 506). Referring to FIG. 13, the milling and/or drilling process removes first portion 322 of buried vias 320 to form blind slot 306, which has a depth 326. Second portion 329 of buried vias 320 remain after forming blind slot 306. Milling and/or drilling blind slot 306 also forms major surface 309 of blind slot 306.

Fabricating PCB 300 according to method 500 continues by bonding an electrically conductive plating to major surface 309 and sidewalls 313 of blind slot 306 (see step 508). Referring to FIG. 3, electrically conductive plating 308 is bonded to major surface 309 and sidewalls 313 of blind slot 306. Electrically conductive plating 308 is electrically and/or thermally coupled to second portion 329 of buried vias 320 that remain after milling and/or drilling first outer surface 302 and is also electrically and/or thermally coupled to outer conductive layer 316 disposed on second outer surface 304 of PCB 300 through blind vias 324.

Method 500 will next be discussed with respect to PCB 400 of FIG. 4. Fabricating PCB 400 according to method 500 begins by fabricating one or more conductive vias in one or more insulating layers (see step 502). Referring to FIGS. 14-18, insulating layers 411 and conductive layers 416, 418 are laminated together (see FIG. 14), drilled and plated to form blind vias 420 (see FIG. 15, vias 420 will be blind after final lamination) having holes 1502. Holes 1502 are filled with material 423 (see step 504 and FIG. 16). Insulating layers 410, 411 and conductive layers 414, 416, 418 are laminated together as a final lamination step (see FIG. 17). In some embodiments, blind vias 420 are fabricated after final lamination using controlled-depth drilling.

Figure 18:
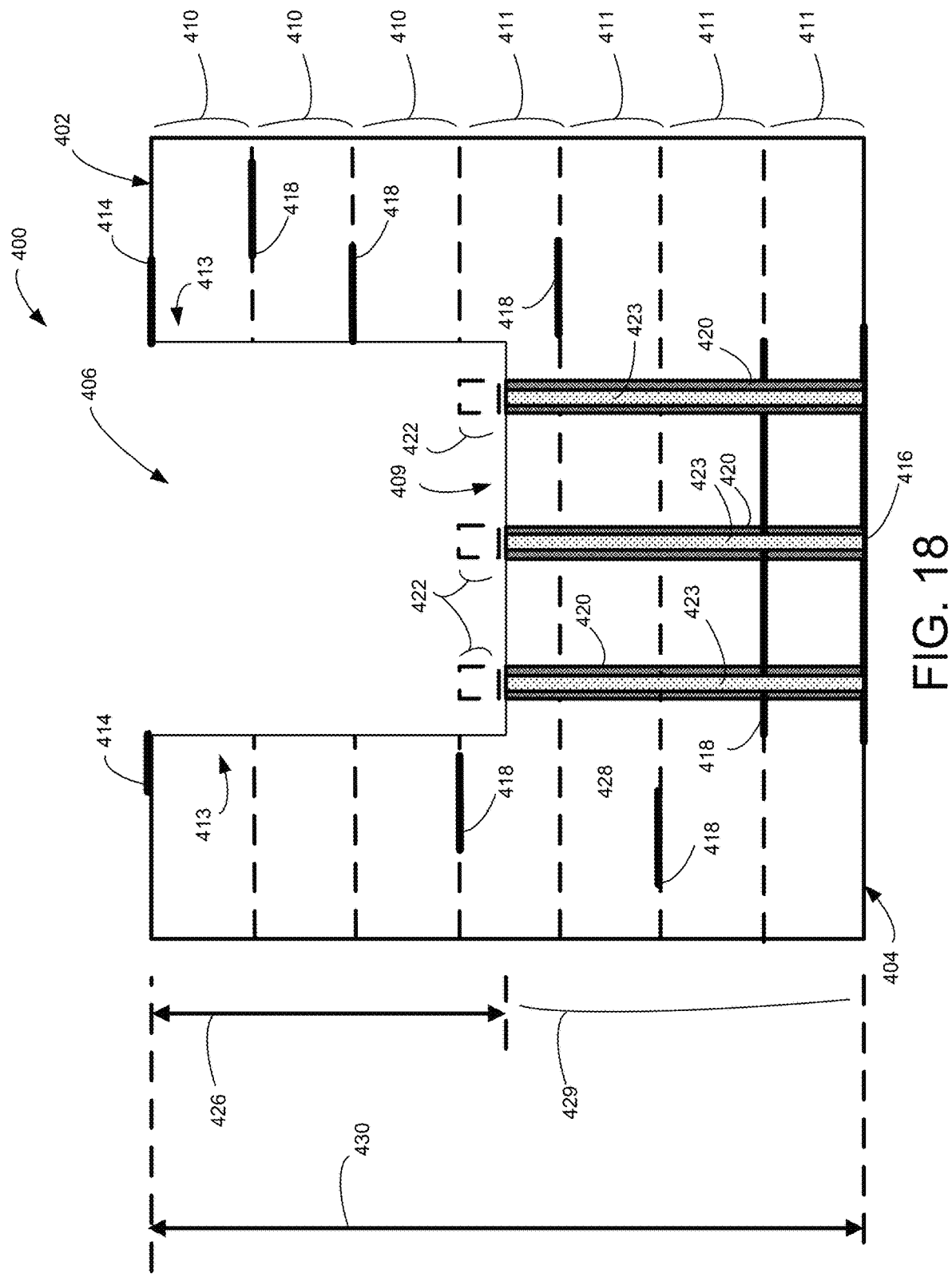

Fabricating PCB 400 according to method 500 continues by performing a milling and/or drilling process on first outer surface 402 to form a blind slot (see step 506). Referring to FIG. 18, the milling and/or drilling process removes first portion 422 of blind vias 420 to form blind slot 406, which has a depth 426. Second portion 429 of blind vias 420 remain after forming blind slot 406. Milling and/or drilling blind slot 406 also forms major surface 409 of blind slot 406.

Fabricating PCB 400 according to method 500 continues by bonding an electrically conductive plating to major surface 409 and sidewalls 413 of blind slot 406 (see step 508). Referring to FIG. 4, electrically conductive plating 408 is bonded to major surface 409 and sidewalls 413 of blind slot 406. Electrically conductive plating 408 is electrically and/or thermally coupled to second portion 429 of blind vias 420 that remain after milling and/or drilling first outer surface 402 and is also electrically and/or thermally coupled to outer conductive layer 416 disposed on second outer surface 404 of PCB 400.

Figure 19:
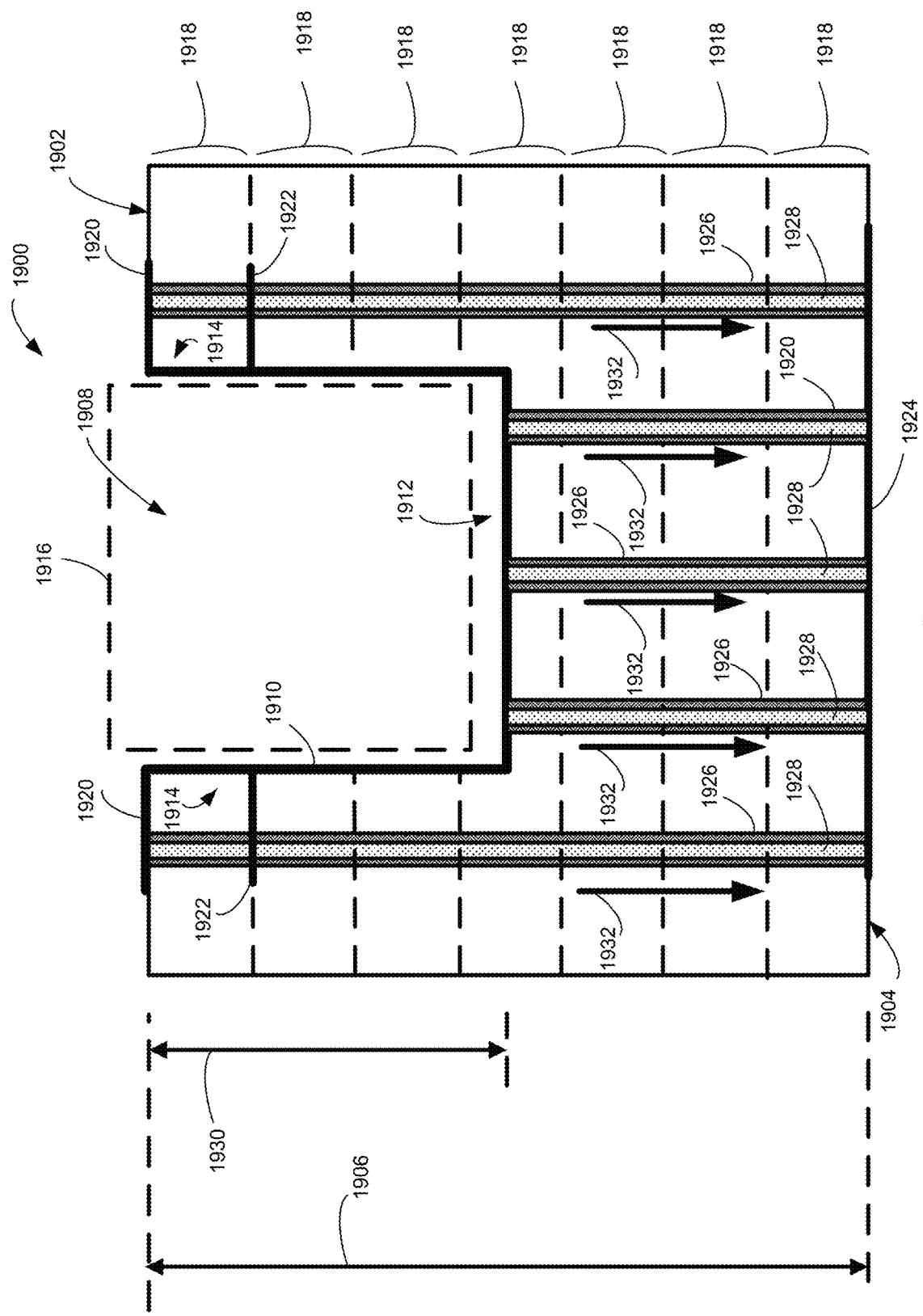
FIG. 19 depicts a cross-section of another PCB that utilizes a plated blind slot that is electrically and/or thermally coupled to through-hole vias in an example embodiment.

FIG. 19 depicts a cross-section of a PCB 1900 in an example embodiment. In this embodiment, PCB 1900 includes a first outer surface 1902 and a second outer surface 1904 that oppose each other and are separated by a width 1906 of PCB 1900. First outer surface 1902 has been milled and/or drilled and plated in FIG. 19 to form a blind slot 1908, which includes an electrically conductive plating 1910 bonded along a major surface 1912 and sidewalls 1914 of blind slot 1908. Blind slot 1908 may be referred to as a blind hole in some embodiments.

Major surface 1912 is substantially parallel to outer surface 1902, and sidewalls 1914 are substantially perpendicular to outer surface 1902 (e.g., sidewalls 1914 extend between outer surfaces 1902, 1904) in some embodiments. In other embodiments, major surface 1912 has a non-planar shape that depends on how material is removed from first outer surface 1902 when fabricating blind slot 1908.

Electrically conductive plating 1910 of blind slot 1908 in this embodiment secures a tab 1916 of a component (e.g., a tab of an inductor) during a reflow process when components are assembled onto first outer surface 1902 (e.g., blind slot 1908 may have solder paste added thereto (not shown), which melts during reflow and forms a solder joint between tab 1916 and electrically conductive plating 1910). Blind slot 1908 in this embodiment partially extends from first outer surface 1902 towards second outer surface 1904.

In this embodiment, PCB 1900 is formed from one or more insulating layers 1918 and conductive layers 1920, 1922, 1924 that are laminated together. Insulating layers 1918 may include various materials including FR-4, which is a fiberglass reinforced epoxy laminate. The number of insulating layers 1918 depicted for PCB 1900 are illustrative only for purposes of discussion, and PCB 1900 may have fewer or more insulating layers 1918 in other embodiments.

PCB 1900 in FIG. 19 includes a number of electrically conductive layers 1920, 1922, 1924, including outer conductive layers 1920, 1924 at outer surfaces 1902, 1904, respectively, and inner conductive layers 1922 between outer surfaces 1902, 1904. Conductive layers 1920, 1922, 1924 may be patterned as desired to route electrical signals, power, and ground through PCB 1900. In this embodiment, PCB 1900 includes a plurality of through-hole vias 1926, which are filled with a material 1928. Material 1928 is used to prevent solder paste applied within blind slot 1908 from wicking away from blind slot 1908 within through-hole vias 1926 towards second outer surface 1904 during reflow when the solder paste melts. Having through-hole vias 1926 unfilled may also generate solder bumps on second outer surface 1904 where through-hole vias 1926 intersect second outer surface 1904, which may cause problems when PCB 1900 is mounted to a second PCB during manufacturing. For example, when PCB 1900 is used for a DC-DC converter module, and the DC-DC converter module is surface mounted (along second outer surface 1904) to another main PCB, then the solder bumps would be both undesirable and uncontrolled.

Material 1928 used to fill through-hole vias 1926 includes epoxy, solder mask, and/or copper, in different embodiments. Through-hole vias 1926 extend vertically in FIG. 19 between major surface 1912 of blind slot 1908 and second outer surface 1904. In this embodiment, through-hole vias 1926 are additionally located proximate to sidewalls 1914 of blind slot 1908 and provide additional electrical conduction paths between conductive plating 1910 of blind slot 1908 and outer conductive layer 1924 at second outer surface 1904. Similar to FIG. 2, portions of through-hole vias 1926 that extend vertically into blind slot 1908 (not shown) have been milled away in FIG. 19 when fabricating blind slot 1908.

Blind slot 1908 in this embodiment has a depth 1930 that corresponds to the portion of through-hole vias 1926 milled away (not shown) when fabricating blind slot 1908. In the configuration depicted in FIG. 19, electrically conductive plating 1910 and through-hole vias 1926 electrically and/or thermally couple with outer conductive layer 1924 of second outer surface 1904 of PCB 1900, providing an electrical and/or thermal conduction path 1932 that is substantially improved over PCB 100 of FIG. 1, as it includes both through-hole vias 1926 proximate to sidewalls 1914 of blind slot 1908 and additional through-hole vias 1926 below blind slot 1908 in FIG. 19.

Figure 20:
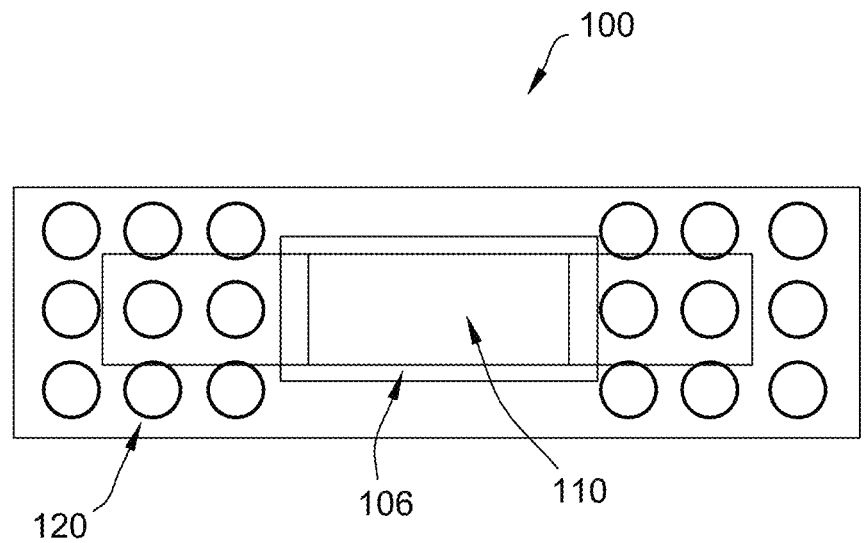
FIG. 20 is top view of PCB 100.
Figure 21:
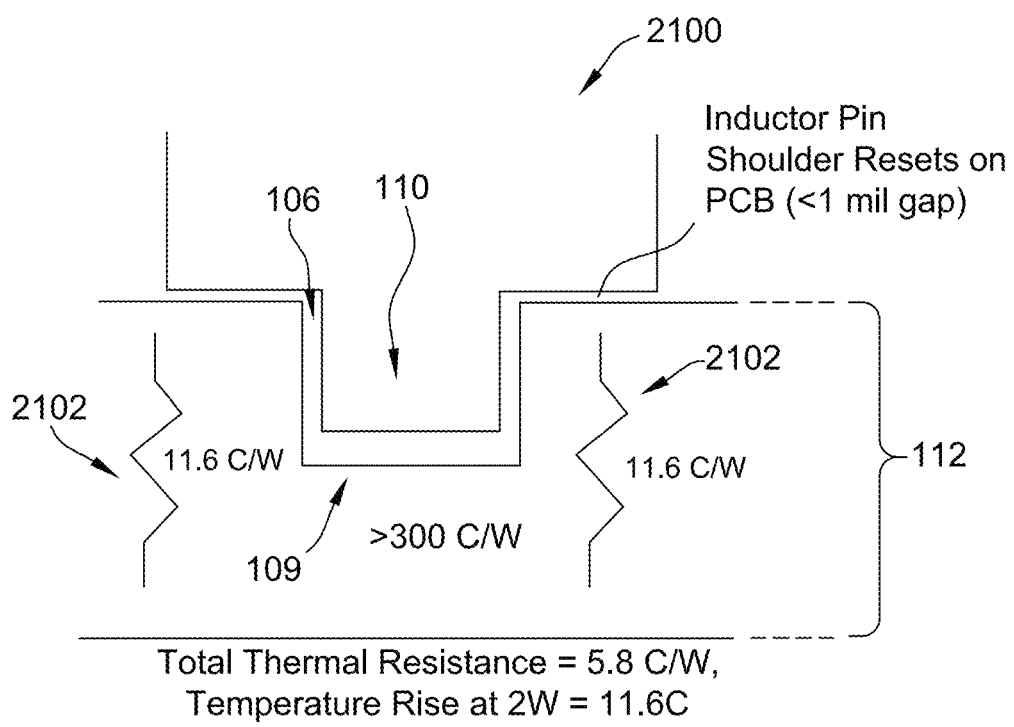
FIG. 21 is a simplified thermal resistance model for PCB 100 at 2 watts thermal conduction.
Figure 22:
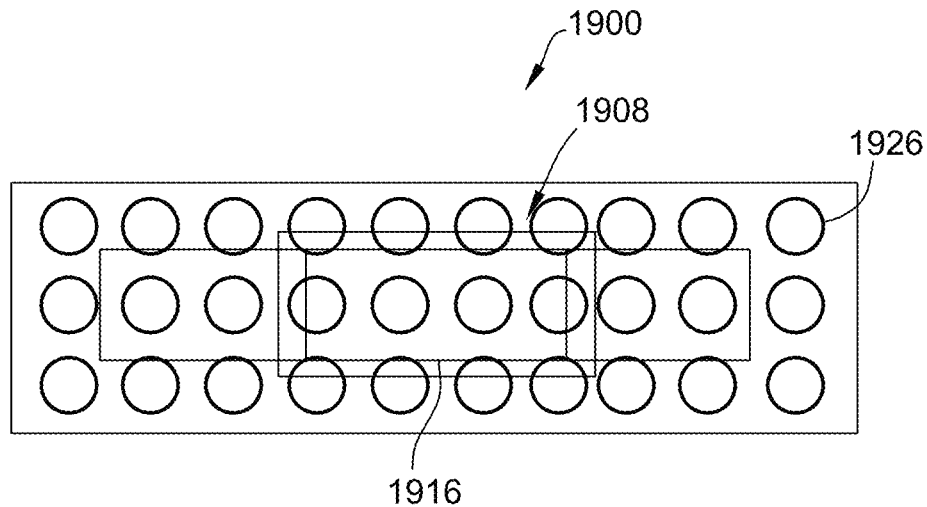
FIG. 22 is a top view of PCB 1900.
Figure 23:
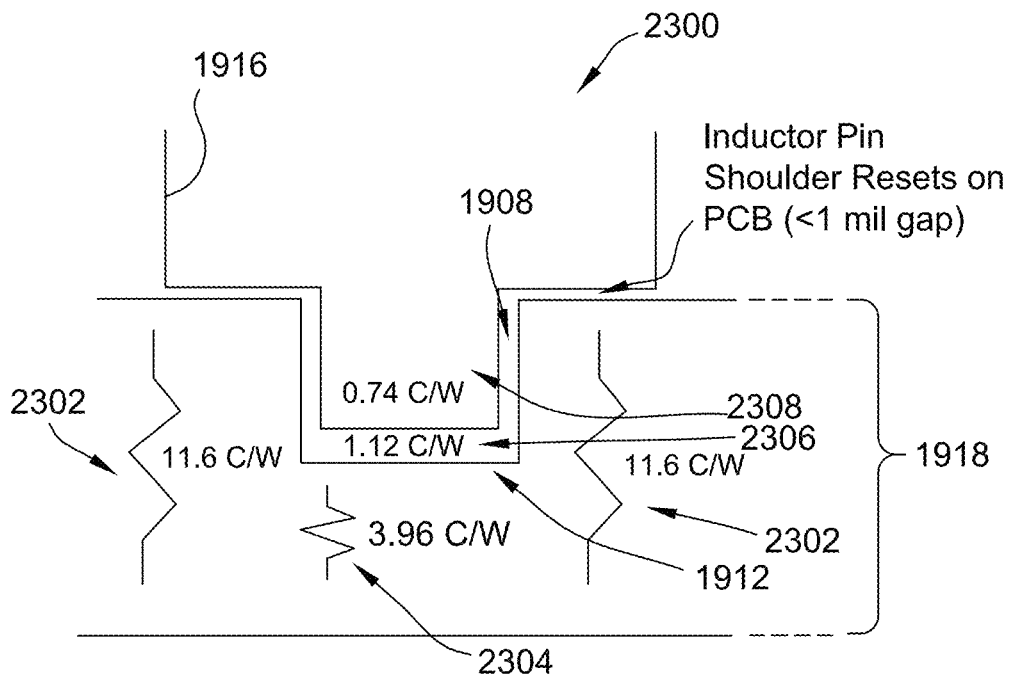
FIG. 23 is a simplified thermal resistance model for PCB 1900 at 2 watts thermal conduction in an example embodiment.

FIG. 20 is a top view of PCB 100 and FIG. 21 is a simplified (e.g., does not include thermal spreading) thermal resistance model 2100 for PCB 100 at 2 watts thermal conduction. FIG. 22 is a top view of PCB 1900 in an example embodiment, and FIG. 23 is a simplified thermal resistance model 2300 for PCB 1900 at 2 watts thermal conduction in an example embodiment. For PCB 100 of FIG. 20, there are a total of 18 vias going completely through PCB 100 (referred to below as complete through-hole vias). Referring to FIG. 21, a thermal resistance 2102 of each group of 9 vias is 11.6 degrees Celsius per Watt (C/W). Two 11.6 C/W thermal resistances 2102 in parallel results in a total thermal resistance of 5.8 C/W through PCB 100. When 2 W is dissipated through the paralleled thermal resistances 2102, the result is a 11.6 C temperature rise.

For PCB 1900 of FIG. 22, there are a total of 30 vias going through PCB 1900. Referring to FIGS. 19 and 23, through-hole vias 1926 beneath blind slot 1908 (referred to below as partial through-hole vias) have a thermal resistance 2304 of 3.96 C/W. Solder (not shown) between tab 1916 and major surface 1912 of blind slot 1908 has a thermal resistance 2306 of 1.12 C/W. A thermal resistance 2308 of tab 1916 is 0.74 C/W. The additional 12 vias below blind slot 1908 have a thermal resistance 2304 of 3.96 C/W, which a total thermal resistance 2304, 2306, 2308 through the center portion of PCB 1900 at blind slot 1908 is 5.82 C/W. Through-hole vias 1926 on either side of blind slot 1908 have a thermal resistance 2302 of 11.6 C/W. This results in a combined thermal resistance of 2.90 C/W, which is 50% lower than for PCB 100. When 2 W is dissipated through the 2.90 C/W thermal resistance of PCB 1900, the result is a 5.8 C temperature rise, which is 50% less than the thermal resistance for PCB 100.

Figure 24:
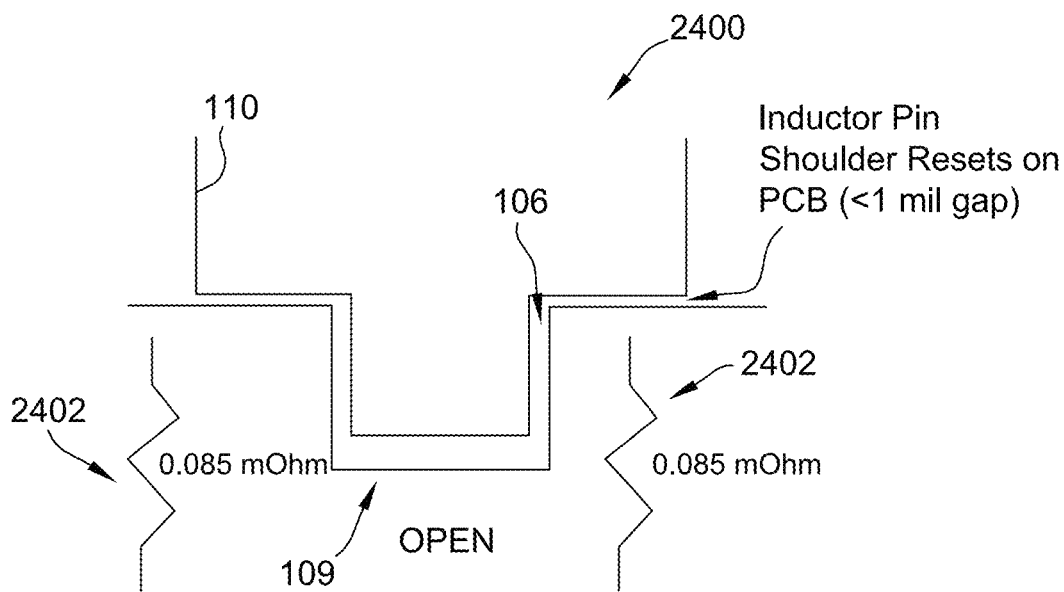
FIG. 24 is a simplified electrical resistance model for PCB 100 at 40 Amps conduction.

FIG. 24 is a simplified (only vertical electrical resistance paths are shown) electrical resistance model 2400 for PCB 100 at 40 Amps conduction. Similar to FIG. 20, there are a total of 18 through-hole vias 120 going through PCB 100. The electrical resistance 2402 for each group of 9 through-hole vias 120 on either side of blind slot 106 is 0.085 milliohms. Two 0.085 milliohm resistances in parallel results in a total electrical resistance of 0.042 milliohm through PCB 100. When 40 Amps is conducted through the 0.042 milliohm electrical resistance, the result is a resistive power loss of 0.068 Watts.

Figure 25:
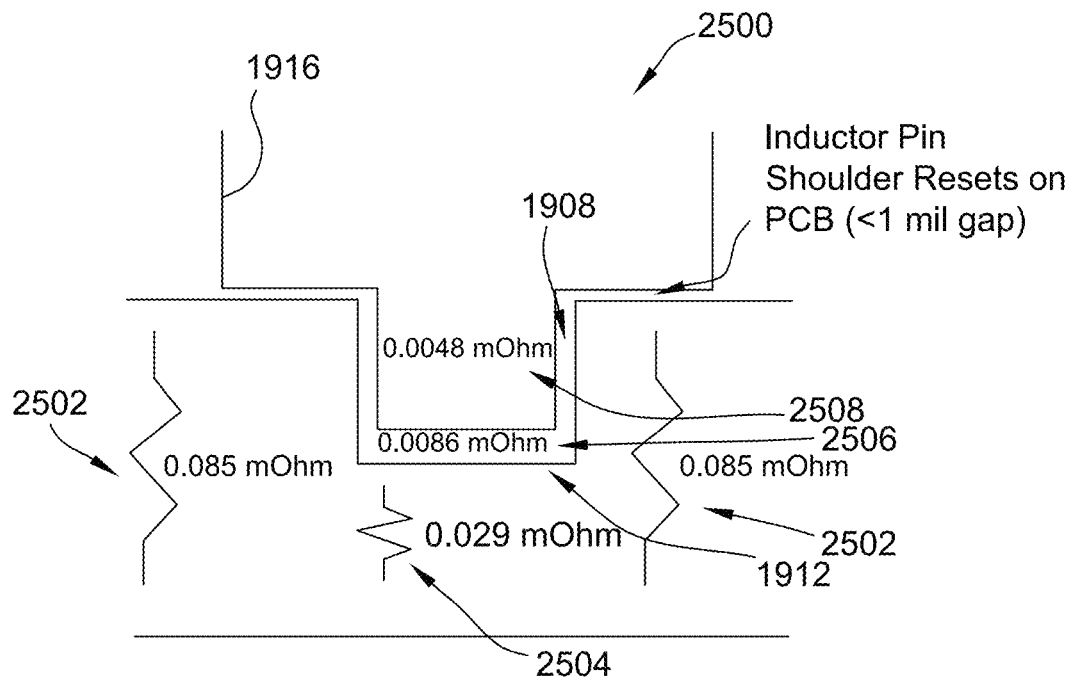
FIG. 25 is a simplified electrical resistance model for PCB 1900 at 40 Amps conduction in an example embodiment.

FIG. 25 is a simplified electrical resistance model 2500 for PCB 1900 at 40 Amps conduction in an example embodiment. Similar to FIG. 22, there are 30 total through-hole vias 1926 going through PCB 1900. Referring to FIGS. 19 and 25, through-hole vias 1926 beneath blind slot 1908 have an electrical resistance 2504 of 0.029 milliohm. Solder (not shown) between tab 1916 and major surface 1912 of blind slot 1908 has an electrical resistance 2506 of 0.0086 milliohm. An electrical resistance 2508 of tab 1916 is 0.0048 milliohm. The additional 12 through-hole vias 1926 below blind slot 1908 have an electrical resistance 2504 of 0.029 milliohm, with a total electrical resistance 2504, 2506, 2508 through the center portion of PCB 1900 at blind slot 1908 is 0.0424 milliohm. Through-hole vias 1926 on either side of blind slot 1908 have an electrical resistance 2502 of 0.085 milliohm. This results in a combined electrical resistance of 0.021 milliohm, which is 50% lower than PCB 100. When 40 Amps is conducted through the 0.021 milliohm electrical resistance of PCB 1900, the result is a resistive power loss of 0.034 Watts, which is 50% less than PCB 100.

Further, calculations show that the use of blind vias or combinations of blind and buried vias rather than through-hole vias 1926 of FIG. 19 also exhibit a 50% improvement in both the electrical resistance and the thermal resistance as compared to PCB 100.

FIGS. 26-29 depict various calculation tables used to calculate the results of one or more of the thermal resistance models of FIGS. 21 and 23 and/or the electrical resistance models of FIGS. 24-25 in example embodiments. The electrical resistances for the tables are calculated as ((Resistivity)*(Length))/(Area), and the thermal resistances for the tables are calculated as (distance)/(area*conductivity).

Table 2600 of FIG. 26 includes the thermal resistance calculations and the electrical resistance calculations for the solder joint of FIGS. 23 and 25. Table 2700 of FIG. 27 includes the thermal resistance calculations and the electrical resistance calculations of the inductor tab 1916 for FIGS. 23 and 25. Table 2800 of FIG. 28 includes the thermal resistance calculations and the electrical resistance calculations for complete through-hole vias in FIGS. 21 and 23-25. Table 2900 of FIG. 29 includes the thermal resistance calculations and the electrical resistance calculations for partial through-hole vias (below blind slot 1908) in FIGS. 23 and 25.

An example technical effect of the apparatus and method described herein includes one or more of: (a) providing improved electrical performance between a plated blind slot and an opposing side of a PCB; and (b) providing improved thermal performance between a plated blind slot and the opposing side of the PCB.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A printed circuit board (PCB) comprising:
   at least one insulating layer comprising a first surface and a second surface opposite the first surface;
   a blind slot that is plated and formed in the at least one insulating layer, the blind slot partially extending from the first surface to the second surface, wherein the blind slot includes a conductive plating bonded along a major surface of the blind slot; and at least one via that is electrically conductive and filled, wherein the at least one via is coupled with and extends between the conductive plating of the blind slot and the second surface of the at least one insulating layer, and wherein the at least one via includes a discontinuation proximate to the major surface of the blind slot where at least a portion of the at least one via has been milled and/or drilled away.

2. The PCB of claim 1, further comprising:
a conductive layer disposed on at least a portion of the second surface of the at least one insulating layer and electrically coupled with the at least one via and the conductive plating of the blind slot.

3. The PCB of claim 2, wherein:
the at least one via thermally couples the conductive layer to the conductive plating of the blind slot.

4. The PCB of claim 1, wherein:
a pre-fabricated structure of the at least one via is transected by the major surface of the blind slot.

5. The PCB of claim 1, wherein:
the at least via comprises one or more through-hole vias.

6. The PCB of claim 1, wherein:
the at least one via is filled with at least one of epoxy, mask, and copper.

7. The PCB of claim 1, wherein:
the at least one via comprises one or more buried vias electrically coupled with one or more blind vias.

8. The PCB of claim 7, wherein:
the one or more buried vias extend from the major surface of the blind slot towards the second surface to electrically connect to the blind vias formed at the second surface.

9. The PCB of claim 1, wherein:
the at least one via comprises one or more blind vias.

10. A method of fabricating a printed circuit board (PCB), the method comprising:
fabricating at least one electrically conductive via in at least one insulating layer, wherein the at least one electrically conductive via extends between a first surface of the at least one insulating layer and a second surface of the at least one insulating layer opposite the first surface;
filling the at least one electrically conductive via;
performing a removal process on the first surface of the at least one insulating layer to form a blind slot that partially extends from the first surface towards the second surface, wherein the removal process removes a first portion of the at least one electrically conductive via as-filled and forms a major surface of the blind slot; and
bonding a conductive plating along the major surface of the blind slot, wherein the conductive plating electrically couples to a second portion of the at least one electrically conductive via.

11. The method of claim 10, wherein:
fabricating the at least one electrically conductive via comprises:
fabricating one or more through-hole vias.

12. The method of claim 11, wherein:
fabricating the one or more through-hole vias further comprises:
performing a drilling operation on the at least one insulating layer to form at least one hole that extends from the first surface to the second surface; and
performing a plating operation on the at least one hole.

13. The method of claim 10, wherein:
fabricating the at least one electrically conductive via further comprises:
fabricating one or more buried vias electrically coupled with one or more blind vias, wherein the one or more buried vias are proximate to the major surface of the blind slot and the one or more blind vias are proximate to the second surface of the at least one insulating layer.

14. The method of claim 10, wherein:
filling the at least one electrically conductive via further comprises:
filling the at least one electrically conductive via with one or more of epoxy, solder mask, and copper.

15. The method of claim 10, wherein:
fabricating the at least one electrically conductive via further comprises:
fabricating one or more blind vias.

16. A printed circuit board (PCB) comprising:
at least one insulating layer including a first major surface and a second major surface opposite the first major surface;
a blind slot formed in the at least one insulating layer, the blind slot partially extending from the first major surface towards the second major surface, wherein the blind slot includes sidewalls extending between the first major surface and the second major surface, and a bottom extending between the sidewalls;
a first conductive layer disposed on the bottom and the sidewalls of the blind slot;
a second conductive layer disposed on at least a portion of the second major surface of the at least one insulating layer; and
a plurality of vias that are electrically conductive and filled, wherein the plurality of vias are electrically coupled with and extend between the first conductive layer disposed on the bottom of the blind slot and the second conductive layer disposed on the second major surface, wherein the plurality of vias comprise at least one buried via electrically coupled with at least one blind via, and wherein each of the plurality of vias include a discontinuation proximate to the bottom of the blind slot where at least a portion of the plurality of vias have been milled and/or drilled away.

17. The PCB of claim 16, wherein:
a pre-fabricated structure of the at least one buried via is transected by the bottom of the blind slot.

18. The PCB of claim 16, wherein:
the plurality of vias thermally couple the first conductive layer to the second conductive layer.

19. The PCB of claim 16, wherein:
the at least one buried via is filled with at least one of epoxy, mask, and copper.

20. The PCB of claim 16, wherein:
the at least one buried via extends from the first conductive layer disposed on the bottom of the blind slot towards the second major surface to electrically connect to the at least one blind via formed at the second major surface.

* * * * *